(12) United States Patent
Hsu et al.

(10) Patent No.: US 6,370,052 B1
(45) Date of Patent: Apr. 9, 2002

(54) METHOD AND STRUCTURE OF TERNARY CAM CELL IN LOGIC PROCESS

(75) Inventors: Fu-Chieh Hsu, Saratoga; Wingyu Leung, Cupertino, both of CA (US)

(73) Assignee: Monolithic System Technology, Inc., Sunnyvale, CA (US)

( * ) Notice: Subject to any disclaimer, the term of this patent is extended or adjusted under 35 U.S.C. 154(b) by 0 days.

(21) Appl. No.: 09/618,863

(22) Filed: Jul. 19, 2000

(51) Int. Cl.[7] .............................................. G11C 15/00
(52) U.S. Cl. ........................... 365/49; 365/154; 365/190
(58) Field of Search ........................... 365/49, 154, 190

(56) References Cited

U.S. PATENT DOCUMENTS

| | | |
|---|---|---|
| 3,949,383 A | 4/1976 | Askin et al. |
| 3,969,708 A | 7/1976 | Sonoda |
| 4,023,149 A | 5/1977 | Bormann et al. |
| 4,831,585 A * | 5/1989 | Wade et al. .................. 365/49 |
| 4,833,643 A | 5/1989 | Hori |
| 5,020,028 A | 5/1991 | Wanlass |
| 5,047,979 A | 9/1991 | Leung |
| 5,319,590 A | 6/1994 | Montoye |
| 5,515,310 A * | 5/1996 | Winters ........................ 365/49 |
| 5,642,320 A | 6/1997 | Jang |
| 5,930,161 A * | 7/1999 | Sheikholeslami et al. ..... 365/49 |
| 6,166,938 A * | 12/2000 | Wong ........................ 365/49 |

OTHER PUBLICATIONS

Takeda, Et Al., "A 16Mb 400MHz Loadless CMOS Four–Transistor SRAM Macro," ISSCC 2000, p. 264–265, (Feb. 8, 2000).

Shafai, Et Al., "Fully Parallel 30–MHz, 2.5–Mb CAM," IEEE Journal of Solid–State Circuits, vol. 33 (No. 11), p. 1690–1696, (Nov. 1998).

* cited by examiner

Primary Examiner—Amir Zarabian
Assistant Examiner—VanThu Nguyen
(74) Attorney, Agent, or Firm—Bever, Hoffman & Harms, LLP; Jeanette S. Harms

(57) ABSTRACT

A ternary dynamic CAM cell compatible with a standard logic process includes two ratio-independent 4-transistor (4T) SRAM cells. Each 4T SRAM cell includes a pair of cross-coupled driver transistors for storing data value, and a pair of access transistors. The driver transistors are sized to not be stronger than the access transistors. In one embodiment, the driver and access transistors are PMOS and NMOS, respectively, and are all substantially the same size. A match circuit for each 4T SRAM cell includes a pair of pass transistors serially coupled between a match line and a supply voltage. If the comparand and stored data bits do not match, both pass transistors are turned on, pulling the match line to the supply voltage. "A DON'T CARE" state is created by writing the same logic value to both 4T SRAM cells, so that both match circuits remain off for all input comparands.

38 Claims, 15 Drawing Sheets

METHOD AND STRUCTURE OF TERNARY CAM CELL IN LOGIC PROCESS

FIELD OF THE INVENTION

The present invention relates to content addressable memory (CAM) cells. More specifically, the present invention relates to a space-efficient ternary CAM cell fabricated using standard ASIC or logic processes.

BACKGROUND OF THE INVENTION

CAM cells are defined as memory cells that are addressed in response to their content, rather than by a physical address in an array. In a CAM cell array, a specified data string, or comparand, is compared to the data stored in each row of CAM cells. A match signal is generated by any row of CAM cells containing data that matches the comparand.

FIG. 1 shows a conventional CAM cell 100 as described in U.S. Pat. No. 4,833,643, issued May 23, 1989 to Hori. CAM cell 100 comprises a static random access memory (SRAM) cell 110, a match circuit 120, a word line WL, a bit line BL, a complementary bit line /BL, and a match line ML. SRAM cell 110 comprises NMOS access transistors 101 and 102, a data storage structure 103, and data storage nodes N1 and N2. Access transistor 101 is coupled between bit line BL and node N1, while access transistor 102 is coupled between node N2 and complementary bit line /BL. The gates of access transistors 101 and 102 are coupled to word line WL.

Match circuit 120 comprises NMOS transistors 121–124. Transistors 121 and 122 are serially coupled between match line ML and ground, thereby forming a stacked transistor string 125. Transistors 123 and 124 are likewise serially coupled between match line ML and ground, thereby forming a stacked transistor string 126. The gates of transistors 122 and 124 are connected to bit line BL and complementary bit line /BL, respectively. The gates of transistors 121 and 123 are coupled to data storage nodes N2 and N1, respectively.

During a read or write operation to CAM cell 100, word line WL is raised to a logic HIGH voltage, thereby turning on access transistors 101 and 102. Data on bit line BL and complementary bit line /BL is then written to data storage nodes N1 and N2, respectively, or data stored at nodes N1 and N2 can be read out to bit lines BL and /BL, respectively.

During a match operation, each bit of the input comparand is compared with a corresponding stored data bit in each row of CAM cells. At the start of the match operation, a data bit B, and a complementary data bit /B, are already stored at nodes N1 and N2, respectively, of SRAM cell 110. Word line WL is set to a logic LOW voltage and match line ML is precharged to a logic HIGH voltage. A comparand data bit C and its complementary data bit /C are applied to bit lines BL and /BL, respectively. If stored data bits B and /B do not match comparand data bits C and /C, respectively, both transistors in either transistor string 125 or 126 will be on and match line ML will be discharged to ground. If the stored data bits match the comparand data bits, CAM cell 100 does not provide a discharge path for match line ML. This match function performed on bits B and C by match circuit 120 is summarized in Table 1.

TABLE 1

Match Function of CAM Cell 100

| Data Bit B | Data Bit C | Signal Effect On Match Line ML |
| --- | --- | --- |
| LOW | LOW | Maintain (MATCH) |
| LOW | HI | Discharge (NO MATCH) |
| HI | LOW | Discharge (NO MATCH) |
| HI | HI | Maintain (MATCH) |

If any CAM cell in a particular row detects a no-match condition, the match line associated with that row is discharged. Therefore, a match for an input comparand is only indicated if every CAM cell in the row detects a match.

CAM cell 100 is a two-state, or "binary," device; i.e., the cell can store either a logic LOW or a logic HIGH. However, many modern CAM applications, such as Internet protocol (IP) and asynchronous transfer mode (ATM) communications networks, require a "ternary" storage capability. More specifically, the CAM cells in such applications must be able to store a "DON'T CARE" state that returns a match signal regardless of the compare input. FIG. 2 shows a ternary CAM cell 200, as described in U.S. Pat. No. 5,319,590, issued Jun. 7, 1994 to Montoye.

CAM cell 200 provides ternary operation by combining two SRAM memory cells into a single circuit. CAM cell 200 comprises SRAM cells 210a and 210b bit lines BLa and BLb, complementary bit lines /BLa and /BLb, a word line WL, a match circuit 220, and a match line ML.

SRAM cells 210a and 210b are substantially similar to SRAM cell 110 of CAM cell 100 and operate in a similar fashion to store a data bit Ba and data bit Bb (provided via bit lines BLa and BLb, respectively) at data storage nodes N1a and N1b, respectively.

Match circuit 220 comprises NMOS transistors 221–224. Transistors 221 and 222 are serially coupled between match line ML and ground, forming a stacked transistor string 225. Transistors 223 and 224 are likewise serially coupled between match line ML and ground, forming a stacked transistor string 226. The gates of transistors 222 and 224 are connected to bit lines BLa and BLb, respectively. The gates of transistors 221 and 223 are coupled to nodes N1a and N1b, respectively.

During a write operation to CAM cell 200, word line WL is raised to a logic HIGH voltage, turning on access transistors 201a, 202a, 201b, and 202b. Data on bit lines BLa and BLb can then be written to data storage nodes N1a and N1b respectively. Complementary data can be written at the same time to data hold circuits 203a and 203b from complementary bit lines /BLa and /BLb, respectively. However, for the purposes of CAM cell 200, only the data stored at nodes N1a and N1b are relevant. SRAM cells 210a and 210b therefore operate as "half-cells", wherein only half of the data stored within those cells is used for comparison purposes. Specifically, the complementary data within cells 210a and 210b are ignored.

During a typical write operation, a data bit B on bit line BLa and its complementary data bit /B on bit line BLb are stored at nodes N1a and N1b respectively. For example, to store a logic HIGH in CAM cell 200, a logic HIGH (bit B) is written to node N1a and a logic LOW (bit /B) is written to node N1b. Similarly, to store a logic LOW in CAM cell 200, a logic LOW (bit B) is written to node N1a and a logic HIGH (bit /B) is written to node N1b.

During a match operation, word line WL is set to a logic LOW voltage, turning off transistors 201a and 201b. Match line ML is precharged to a logic HIGH voltage, and a comparand data bit C and its complementary data bit /C are applied to bit lines BLb and BLa, respectively. If data bits B and /B are stored in CAM cell 200, XNOR match circuit 220 performs the comparison in much the same fashion as XNOR match circuit 120 shown in FIG. 1. If stored data bit B matches comparand data bit C, at least one transistor in each of transistor strings 225 and 226 will be turned off, and match line ML will be maintained at a logic HIGH voltage. If stored data bit B does not match comparand data bit C, both transistors in either transistor string 225 or 226 will be turned on, and match line ML will be discharged to ground.

In addition to the logic HIGH and LOW states described previously, CAM cell 200 can store a logic LOW value at both nodes N1a and N1b. This "DON'T CARE" state causes CAM cell 200 to indicate a match condition for any comparand data bit C. Specifically, if a "DON'T CARE" state is stored in CAM cell 200, match circuit 220 is turned off (i.e., transistors 221 and 223 are turned off, disabling stacked transistor strings 225 and 226, respectively), and match line ML will not be discharged regardless of the value of comparand bit C. These operations of CAM cell 200 are summarized in Table 2.

TABLE 2

Ternary Function of CAM Cell 200

| Data Bit B | Data Bit C | Signal Effect On Match Line ML |
|---|---|---|
| LOW | LOW | Maintain (MATCH) |
| LOW | HIGH | Discharge (NO MATCH) |
| HIGH | LOW | Discharge (NO MATCH) |
| HIGH | HIGH | Maintain (MATCH) |
| DON'T CARE | LOW | Maintain (MATCH) |
| DON'T CARE | HI | Maintain (MATCH) |

However, while CAM cell 200 does provide ternary operation, the increased functionality comes with a significant increase in overall cell size. The die area required for the SRAM cells is doubled over conventional binary CAM cells. The particular SRAM cells used in a ternary CAM cell therefore play a significant role in determining the overall size of the CAM cell.

Traditional static RAM (SRAM) uses either 4 transistors and 2 resistors (4T-2R) in each memory cell or 6 transistors (6T) in each memory cell as shown in FIGS. 3 and 4 respectively. The 4T-2R cell 300 shown in FIG. 3 includes NMOS access transistors 301 and 302, NMOS driver transistors 303–304 and load resistors 305 and 306. Load resistors 305 and 306 are typically polysilicon elements that require special processing, which is generally not available in a conventional ASIC or logic process.

The CMOS 6T cell 400 shown in FIG. 4 includes NMOS access transistors 401 and 402, NMOS driver transistors 403 and 404, and PMOS pull-up transistors 405 and 406. The large size of CMOS 6T cell 400, due to the use of both PMOS and NMOS transistors, limits the density of an array formed using these 6T cells.

To reduce the RAM cell size, resistors 305 and 306 of 4T-2R cell 300, or pull-up transistors 405 and 406 of 6T cell 400 can be eliminated to create the 4T RAM cell 500 shown in FIG. 5. 4T cell 500 includes NMOS access transistors 501 and 502 and NMOS driver transistors 503 and 504. An internal HIGH voltage level is stored on one of nodes N1 or N2 of cell 500, and an internal LOW voltage level is stored on the other one of nodes N1 or N2. The internal HIGH voltage level on node N1 or N2 of cell 500 can only reach the level of word line (WL) turn-on voltage applied to the gates of access transistors 501 and 502 minus one threshold voltage (VT). The internal HIGH voltage level can therefore be substantially lower than the Vcc supply voltage.

Because 4T RAM cell 500 is constructed with four transistors of the same polarity, significant leakage currents exist in cell 500. In a conventional ASIC or logic process, these leakage currents can include sub-threshold leakage, junction leakage and gate tunneling leakage currents. These leakage currents necessitate frequent refresh operations to restore the internal HIGH voltage level stored on node N1 or N2 of cell 500. Thus, cell 500 is a dynamic random access memory (DRAM) cell. Bias and refresh techniques which are used to prevent the complete loss of the internal HIGH voltage level are described in U.S. Pat. No. 3,949,383 entitled "D.C. Stable Semiconductor Memory Cell" by H. O. Askin et al., U.S. Pat. No. 4,023,149 entitled "Static Storage Technique For Four Transistor IGFET Memory Cell" by A. R. Bormann et al., and U.S. Pat. No. 5,020,028 entitled "Four Transistor Static RAM Cell" by Frank Wanlass.

Moreover, while the internal HIGH voltage level on node N1 or N2 of cell 500 is being replenished, the leakage current through the other node (i.e., the LOW voltage node) can be several orders of magnitude higher than the normal leakage current, thereby resulting in very high standby current consumption.

In an attempt to overcome these problems, a larger 4T CMOS cell has been proposed by K. Takeda et al. in "A 16 Mb 400 MHz Loadless CMOS Four-Transistor SRAM Macro", ISSCC 2000, pp. 264–265, Feb. 8, 2000. FIG. 6 illustrates this CMOS 4T cell 600, which includes PMOS access transistors 601 and 602 and NMOS driver transistors 603 and 604. The internal HIGH voltage level on node N1 or N2 of cell 600 is maintained through sub-threshold leakage current through access PMOS transistors 601 and 602, which is created by pre-charging bit lines BL and /BL to supply voltage Vcc.

Because an NMOS transistor is typically 3 times stronger than a PMOS transistor with the same drawn dimensions, CMOS 4T cell 600 can satisfy the cell stability requirements of standard SRAM read operations, which specify that the driver transistor should be 3 times the strength of the access transistor or more. This cell stability requirement is discussed in detail in U.S. Pat. No. 5,047,979 entitled "High Density SRAM Circuit With Ratio Independent Memory Cells" by Wingyu Leung. One significant drawback of 4T CMOS cell 600 is that the gate tunneling current can be very high across the gate oxide of a turned-on NMOS transistor, particularly when the gate oxide has a thickness of 4 nm or less, as is the case in a conventional 0.18 micron ASIC or logic process. This high gate tunneling current exists due to very high electron density at either side or both sides of the thin gate dielectric. This high electron density will exist at the node (N1 or N2) that stores the internal HIGH voltage level, and is replenished by the low sub-threshold leakage current through the corresponding PMOS transistor.

Another drawback of 4T RAM cell 600 is that the sub-threshold leakage currents of PMOS transistors 603 and 604 decrease rapidly as the temperature decreases, while the tunneling current changes slowly as the temperature decreases, thereby making 4T RAM cell 600 unstable at lower temperatures.

Switching the NMOS and PMOS polarities can alleviate these problems somewhat. However, such a modification substantially increases the size of the cell since the PMOS driver transistors would then be required to be nine times the size of the NMOS access transistors to maintain SRAM read stability. Thus, conventional CAM cells, especially ternary CAM cells, are typically space/power inefficient.

Accordingly, it is desirable to provide a compact ternary CAM cell that is compatible with standard logic process.

SUMMARY OF THE INVENTION

The present invention provides a space-efficient ternary CAM cell that can be fabricated using a standard logic process, which is a single or twin well process with a single polycrystalline silicon layer and one or more layers of metal.

According to an embodiment of the invention, a CAM cell comprises two ratio-independent four-transistor (4T) SRAM cells. The two 4T SRAM cells enable the CAM cell to provide ternary functionality. Each of the 4T SRAM cells comprises a pair of cross-coupled driver transistors configured to store a data value, and a pair of access transistors coupled to the driver transistors. The driver transistors and access transistors are sized such that the driver transistors are less than three times stronger than the access transistors. In a particular embodiment, the driver transistors are not stronger than the access transistors. Because the driver transistors are not required to be stronger than the access transistors, the resulting 4T SRAM cells are ratio-independent memory cells.

In one embodiment, the driver transistors are PMOS transistors and the access transistors are NMOS transistors, with all of these transistors having substantially the same size. The PMOS and NMOS transistors are fabricated using a conventional ASIC or logic process, so the 4T SRAM cells can be easily incorporated into a system-on-a-chip (SOC) architecture. In one embodiment, the NMOS and PMOS transistors in the 4T SRAM cells are all fabricated with a channel length equal to the minimum channel length available with the process. As a result, the overall layout area of the CAM cell is advantageously minimized.

In one embodiment, each 4T SRAM cell comprises a first PMOS driver transistor coupled between the Vcc voltage supply terminal and a first data storage node (N1), a second PMOS driver transistor coupled between the Vcc voltage supply terminal and a second node (N2), a first NMOS access transistor coupled between the first node N1 and a bit line, and a second NMOS access transistor coupled between the second node N2 and a complementary bit line. The gates of all the NMOS access transistors are coupled to a word line. The second node in each 4T SRAM cell is connected to a match circuit, each match circuit comprising two PMOS transistors serially coupled between a "match voltage" and a match line.

According to a first aspect of the invention, the match circuits are controlled by data stored at the second node of each 4T SRAM cell and comparand data on compare lines. According to a second aspect of the invention, the match circuits are controlled by data stored at the second node of each 4T SRAM cell and comparand data on the bit lines, thereby eliminating the need for additional compare lines and improving layout efficiency.

The PMOS driver transistors can be located in an N-well coupled to receive a voltage greater than a Vcc supply voltage to decrease sub-threshold leakage and thus the standby current of the cell.

In an embodiment of the present invention, when the data stored at nodes N1 and N2 are not being accessed, the word and bit lines are held at a ground (i.e., logic LOW) voltage. This configuration allows the NMOS access transistors to provide enough leakage current to stably maintain the logic LOW node.

The bit lines can also be coupled to a differential regenerative sense amplifier. To read a data value from the CAM cell, the bit lines are isolated from any supply voltage terminal. A logic HIGH voltage is then asserted on the word line, thereby turning on the NMOS access transistors. At this time, a differential voltage representative of the data values stored at nodes N1 and N2 is developed on the bit lines. In response to the differential voltage across the bit lines, the differential regenerative sense amplifier pulls up one bit line to the Vcc supply voltage, and pulls down the other bit line to the ground potential. At the end of the read cycle, the word line is turned off before the sense amplifier is disabled. As a result, the sense amplifier causes the data value read from the CAM cell to be written back to the CAM cell.

During a match operation, the word line is set to a logic LOW voltage, thereby turning off the NMOS access transistors. The match line is then precharged to a predefined logic level, depending on the match voltage of the match circuits. According to a first aspect of the present invention, the match circuits are coupled between supply voltage Vcc and the match line, in which case the match line could be precharged to a logic LOW voltage. According to another aspect of the present invention, the match circuits could be coupled between supply voltage Vss (i.e., ground voltage), in which case the match line could be precharged to a logic HIGH voltage. Alternatively, with either form of match circuits, the match line could be allowed to float to begin the match operation.

A comparand data bit is then applied to one of the bit lines (associated with one of the 4T SRAM cells), and a complementary comparand data bit is applied to the other bit line (associated with the other 4T SRAM cell). If either of the match circuits detects a no-match condition within its associated 4T SRAM cell, then the match line is pulled to the match voltage of the match circuits. Otherwise, the match line remains at its precharge voltage, and a match condition is returned.

The present invention will be more fully understood in view of the following description and drawings.

DETAILED DESCRIPTION OF THE DRAWINGS

The present invention provides a space-efficient CAM cell using a ratio-independent four-transistor (4T) SRAM cell. In the described examples, the positive supply voltage is designated as supply voltage Vcc. In general, the positive supply voltage Vcc can have a nominal value such as 3.3V, 2.5V, 1.8V, etc., depending on the fabrication process. The ground supply voltage, designated as supply voltage Vss, has a nominal value of 0V.

Figure 1:
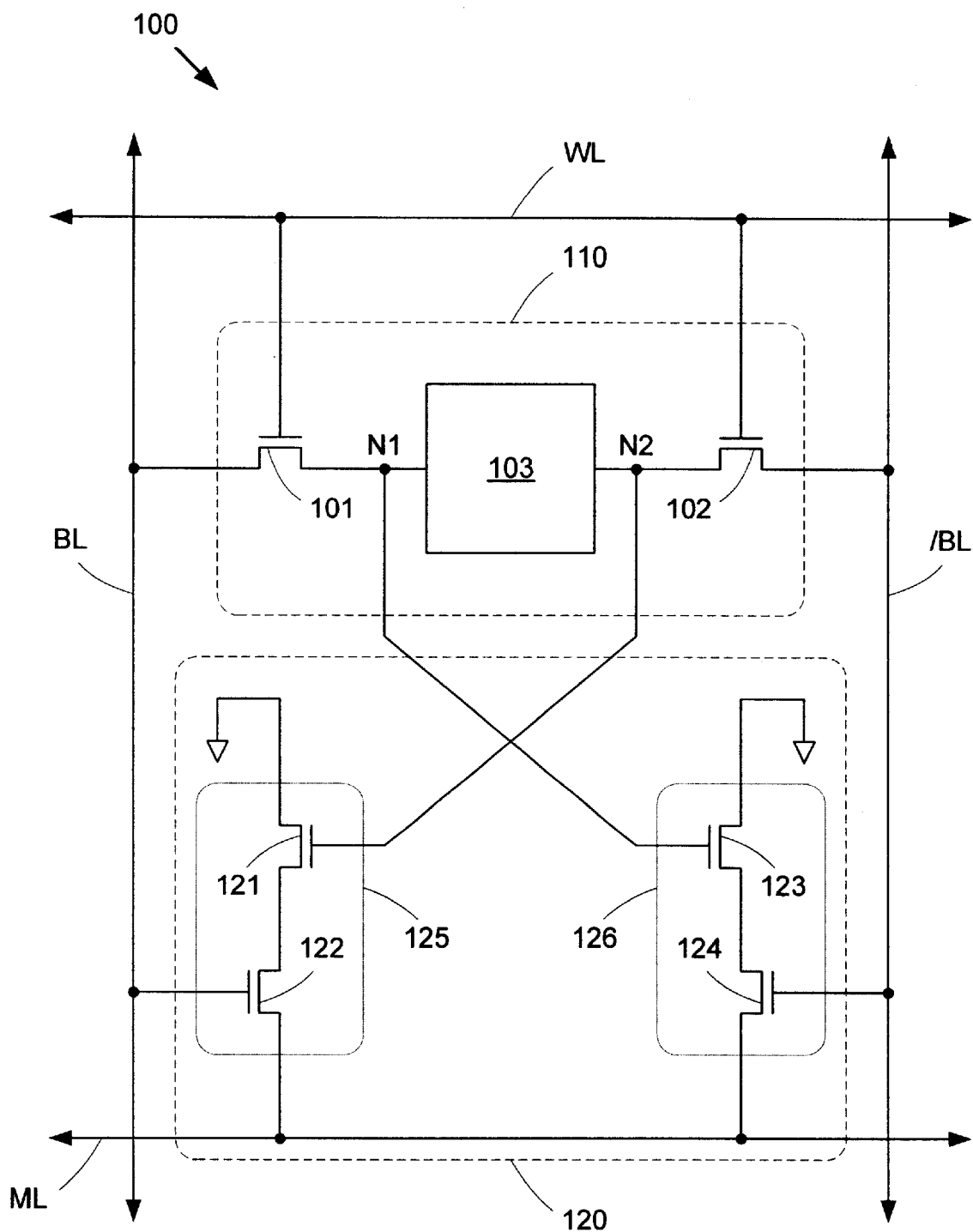
FIG. 1 is a circuit diagram of a conventional binary CAM cell.
Figure 2:
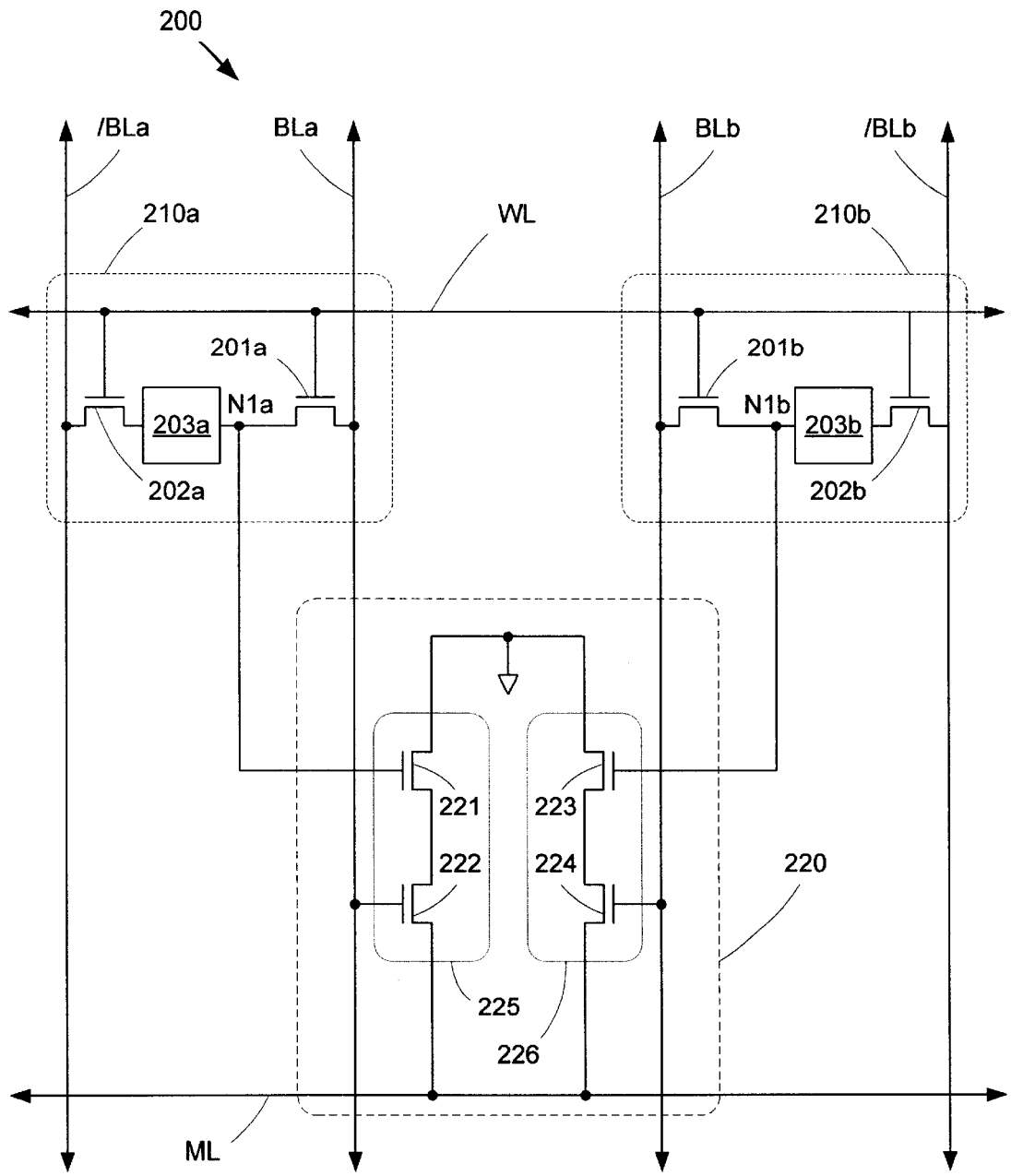
FIG. 2 is a circuit diagram of a conventional ternary CAM cell.
Figure 3:
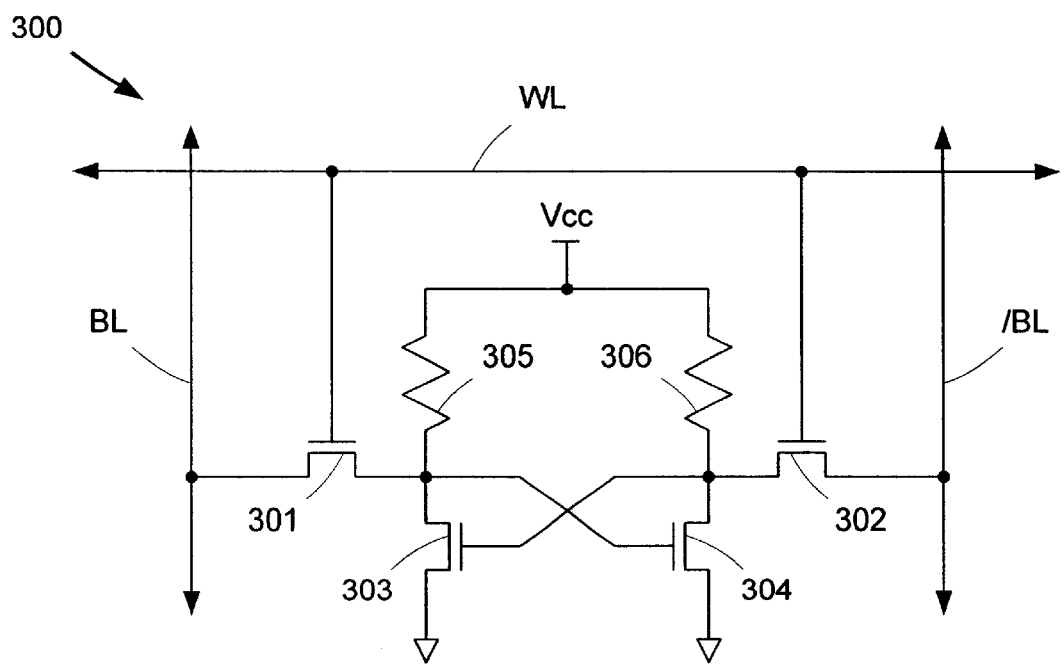
FIG. 3 is a circuit diagram of a conventional 4T-2R SRAM cell.
Figure 4:
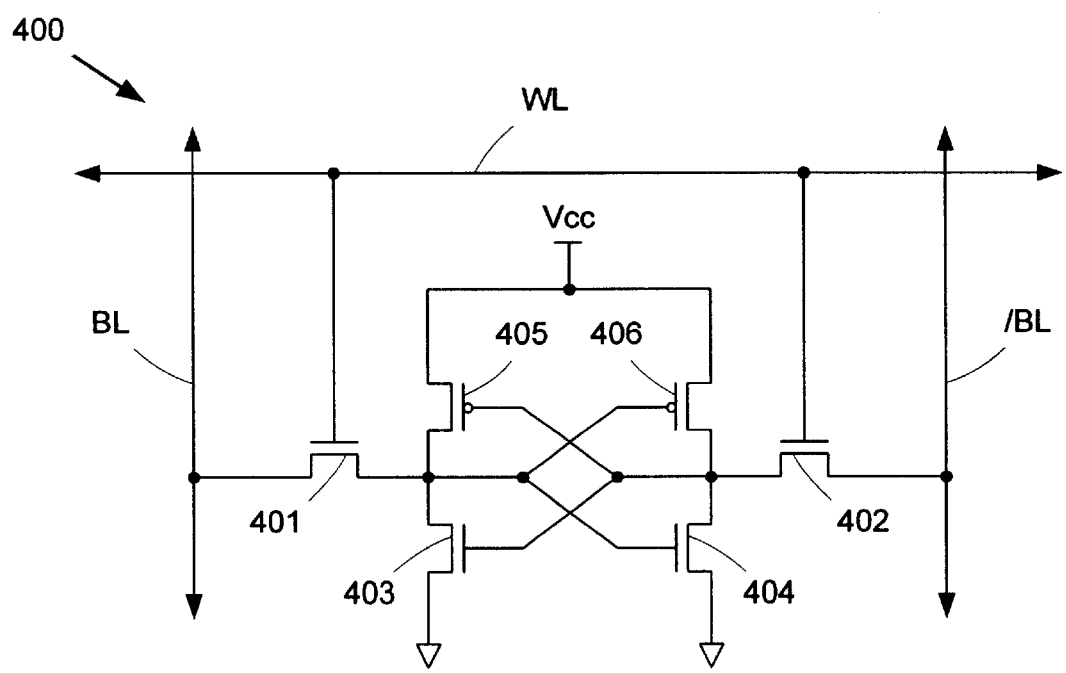
FIG. 4 is a circuit diagram of a conventional CMOS 6T SRAM cell.
Figure 5:
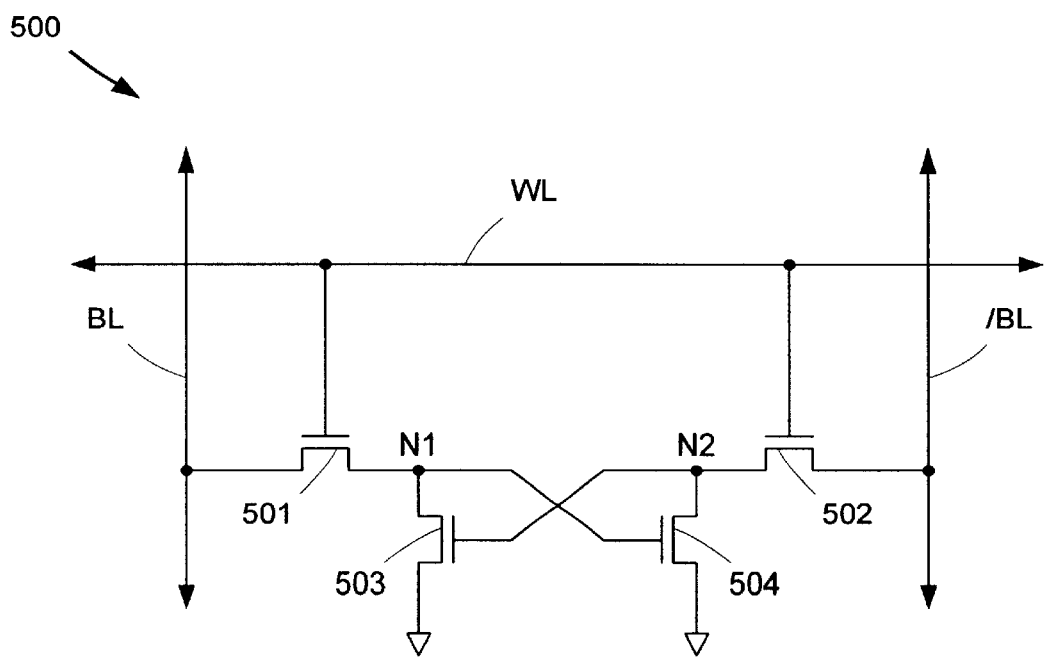
FIG. 5 is a circuit diagram of a conventional 4T DRAM cell.
Figure 6:
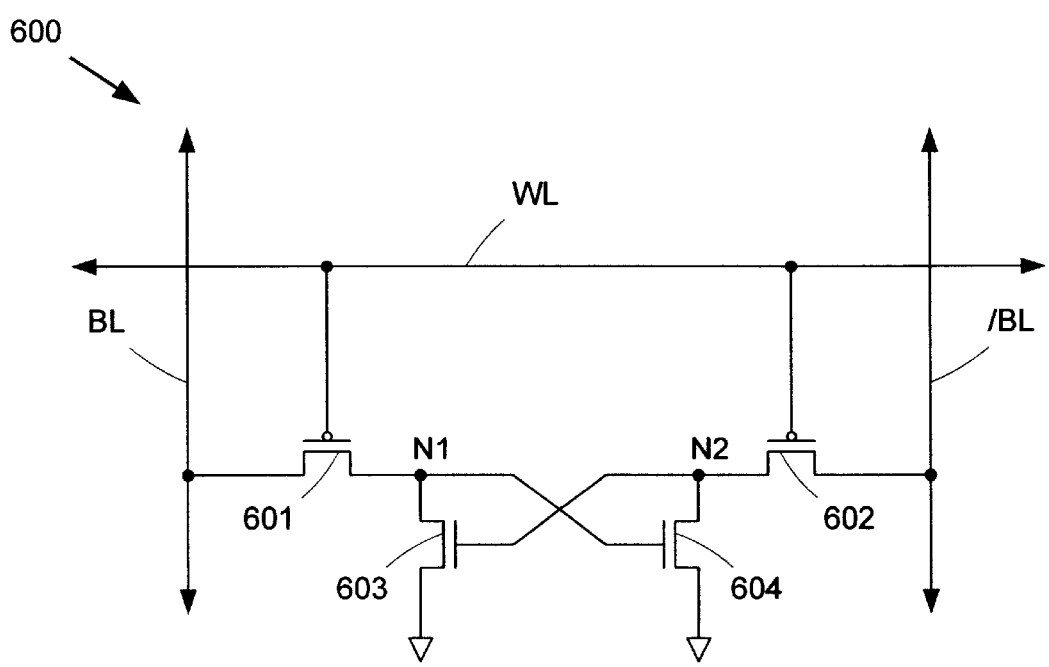
FIG. 6 is a circuit diagram of a conventional CMOS 4T SRAM cell.
Figure 7:
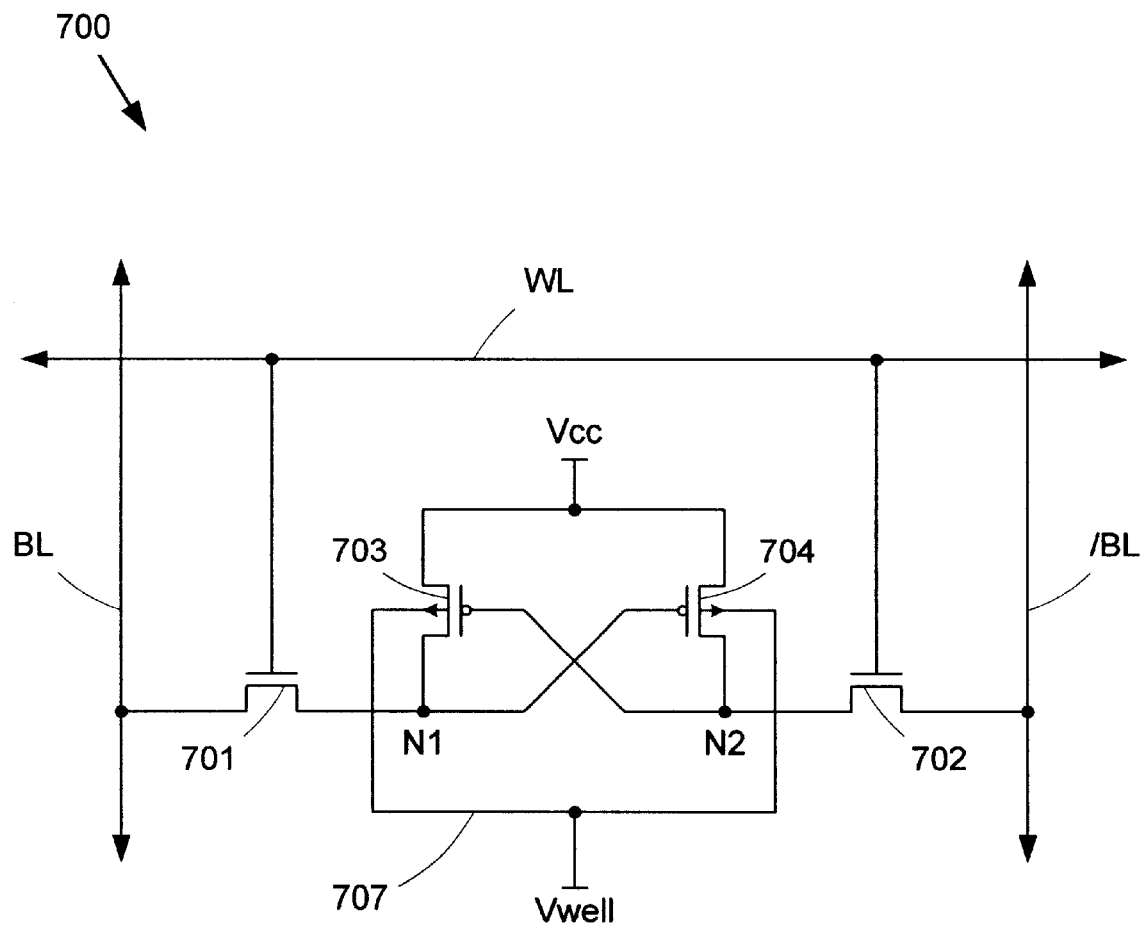
FIG. 7 is a circuit diagram of a ratio-independent 4T SRAM cell constructed using CMOS transistors

FIG. 7 shows a 4T SRAM cell 700, which is described in detail in co-owned and co-pending U.S. patent application Ser. No. 09/568,088 entitled "High-Density Ratio-Independent Four-Transistor RAM Cell Fabricated with a Conventional Logic Process," filed May 9, 2000, and herein incorporated by reference. 4T SRAM cell 700 includes NMOS access transistors 701–702 and PMOS driver transistors 703–704, which are fabricated using a conventional ASIC or logic process. In the described example, cell 700 is constructed using a 0.18 micron n-well process. The gates of access transistors 701–702 are commonly connected to a word line WL. The drains of access transistors 701–702 are connected to bit line BL and complementary bit line /BL, respectively. PMOS transistor 703 is connected between the Vcc voltage supply terminal 706 and the source of access transistor 701 at node N1. PMOS transistor 704 is connected between the Vcc voltage supply terminal 706 and the source of access transistor 702 at node N2. The Vcc voltage supply terminal 706 is coupled to receive a Vcc supply voltage. In the described example, the Vcc supply voltage has a nominal voltage of 1.8 Volts. PMOS driver transistors 703–704 are cross-coupled, such that the gates of transistors 703–704 are coupled to nodes N2 and N1, respectively. PMOS transistors 703–704 are fabricated in an n-type well region 707, which is coupled to receive a well bias voltage Vwell. As described in more detail below, cell 700 stores an internal HIGH voltage on one of nodes N1 and N2, and an internal LOW voltage on the other one of nodes N1 and N2.

In the described example, to minimize the size of cell 700, NMOS transistors 701–702 and PMOS transistors 703–704 are all drawn to approximately the same size (i.e., channel width and channel length), with the channel length and width being close to the minimum allowed by the process. For example, the channel length can be 0.18 microns and the channel width can be 0.4 microns. As a result of the similar sizes of the PMOS and NMOS transistors, the strength of the NMOS access transistors 701–702 are significantly higher than the strength of the PMOS driver transistors 703–704. Note that this is contrary to conventional SRAM cells, wherein the strength of the driver transistors is typically much greater than (3×) the strength of the access transistors, in order to maintain cell stability during read operations. In accordance with the present invention, the PMOS driver transistors 703–704 are less than three times stronger than the NMOS access transistors 701–702. In the described embodiment, PMOS transistors 703–704 are not stronger than the NMOS access transistors 701–702. For this reason, the resulting 4T SRAM cell 700 is referred to as a "ratio independent" cell.

Figure 8:
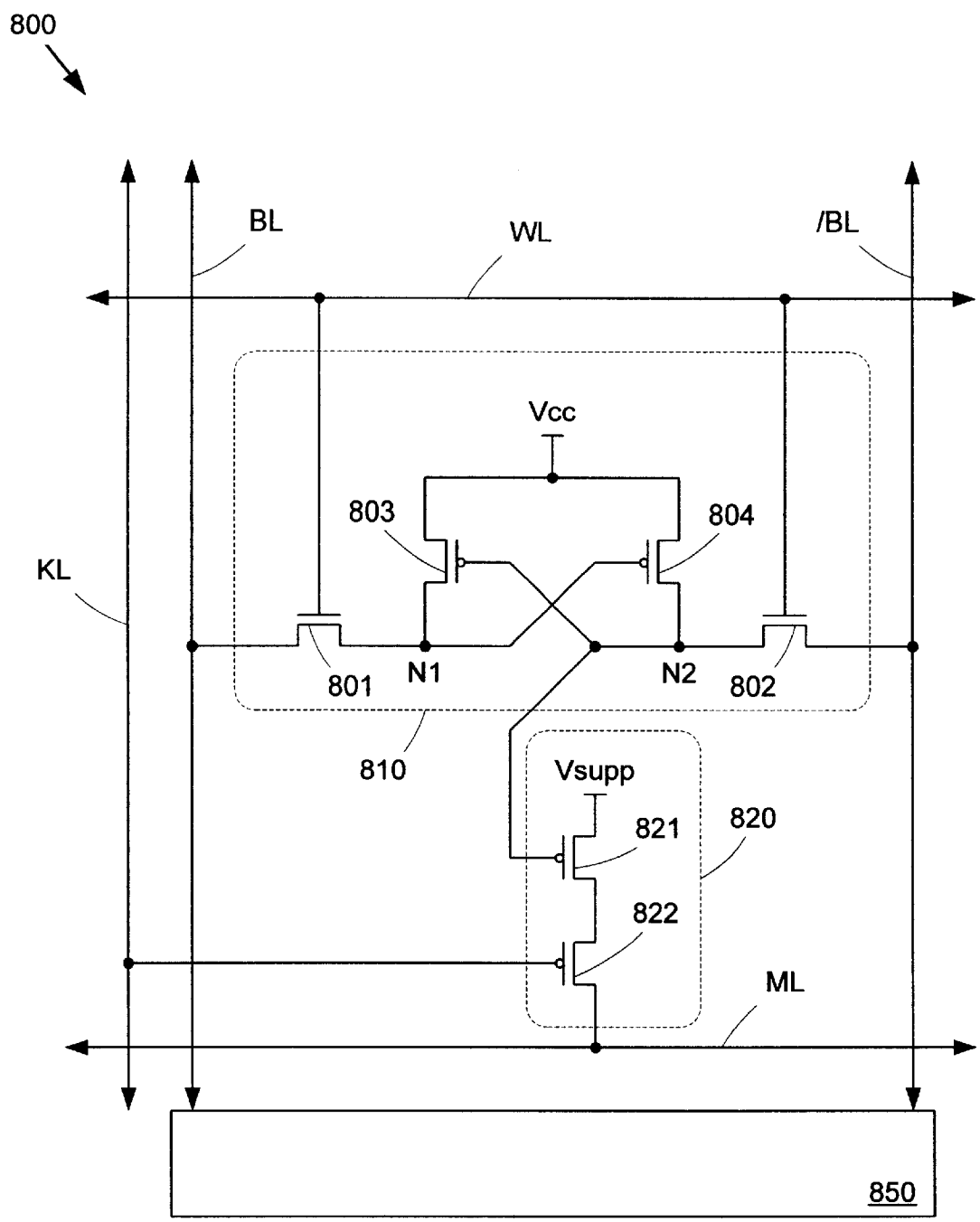
FIG. 8 is a CAM half-cell using a ratio-independent 4T SRAM cell and a dedicated compare line in accordance with an embodiment of the present invention.

According to an aspect of the present invention, 4T SRAM cell 700 can be used in a CAM cell to provide a compact structure. FIG. 8 shows a CAM cell 800 in accordance with an embodiment of the present invention. CAM cell 800 comprises a 4T SRAM cell 810, a match circuit 820, a word line WL, a bit line BL, a complementary bit line /BL, a compare line KL, and a match line ML. SRAM cell 810 comprises NMOS access transistors 801 and 802, and PMOS driver transistors 803 and 804, configured in substantially the same manner as 4T SRAM cell 700 shown in FIG. 7. PMOS driver transistors 803 and 804 are coupled between supply voltage Vcc and storage nodes N1 and N2, respectively. The gate terminals of PMOS driver transistors 803 and 804 are coupled to storage nodes N2 and N1, respectively. NMOS access transistor 801 is coupled between bit line BL and storage node N1, while NMOS access transistor 802 is coupled between complementary bit line /BL and storage node N2. The gates of both NMOS access transistors 801 and 802 are coupled to word line WL. Match circuit 820 comprises PMOS pass transistors 821 and 822, which are serially coupled between supply voltage Vcc and match line ML. The gate terminal of pass transistor 821 is coupled to storage node N2, and the gate terminal of pass transistor 822 is coupled to compare line KL.

According to an aspect of the present invention, PMOS driver transistors 803 and 804 can be located in an N-well coupled to receive a voltage greater than the Vcc supply voltage. This applied voltage advantageously provides a back-bias effect that raises the threshold voltage (VT) of PMOS driver transistors 803 and 804, thereby decreasing sub-threshold leakage and minimizing standby power consumption.

During a read or write operation, word line WL is raised HIGH, turning on access transistors 801 and 802. During a write operation data bit B is written from bit line BL into storage node N1, while a data bit /B, i.e., the complement of data bit B, is written from complementary bit line /BL into storage node N2. During a read operation, data bits B and /B are read from storage nodes N1 and N2, respectively, to bit lines BL and /BL, respectively. A differential regenerative sense amplifier (not shown) coupled to bit lines BL and /BL could read and regenerate the data stored in CAM cell 800.

When the data stored at nodes N1 and N2 are not being accessed, word line WL is held at a ground (i.e., logic LOW) voltage. At this time, bit lines BL and /BL are also held at ground potential. Under these conditions, the data storage node at a logic LOW voltage in 4T SRAM cell 810 is held at a voltage approximately equal to the ground voltage by the relatively large sub-threshold leakage current and junction leakage current through its associated NMOS access transistor. In this manner, the relatively leaky NMOS access transistors 801 and 802 contribute to the stability of CAM cell 800. The data storage node N1 or N2 at a logic LOW voltage causes its associated PMOS driver transistor 804 or 803, respectively to turn on, thereby keeping the potential at the logic HIGH node close to the Vcc supply voltage.

During a match operation, CAM cell 800 compares a comparand data bit C on compare line KL with stored data bit B. (Note that this comparison operation between bits B and C actually involves bit C and the complement of bit B, since match circuit 820 is coupled to node N2, where bit /B is stored.) If a match condition is detected between bits B and C, match circuit 820 remains turned off (i.e., PMOS pass transistor 821 is turned off, thereby disabling match circuit 820), thereby leaving the logic level of match line ML unchanged. However, if a no-match condition between bits B and C is detected, match circuit 820 turns on (i.e., PMOS pass transistors 821 and 822 are both turned on), thereby pulling match line ML to a prespecified logic level. In the embodiment shown in FIG. 8, match circuit 820 pulls match line ML to a logic HIGH voltage (i.e., supply voltage Vcc) when a no-match condition is detected. Alternatively, PMOS pass transistors 821 and 822 of match circuit 820 could be serially coupled between match line ML and ground supply voltage Vss, in which case match line ML would be pulled LOW upon detection of a no-match condition.

To begin the process, word line WL is asserted to a logic LOW voltage to turn off NMOS access transistors 801 and 802, and match line ML is precharged to a logic LOW voltage. In accordance with another aspect of the present invention, if match circuit 820 was coupled between a ground supply voltage and match line ML, match line ML could be precharged to a logic HIGH voltage. Alternatively, match line ML could be set to float at the start of a match operation, thereby only asserting a definite voltage upon detection of a no-match condition by match circuit 820.

Once match line ML has been precharged to the specified voltage, a logic LOW comparand data bit C is then applied to compare line KL, turning on PMOS pass transistor 822. If a logic LOW is stored at node N2 (i.e., data bit B is HIGH), PMOS pass transistor 821 is also turned on, and match line ML is pulled to supply voltage Vcc. Therefore, a no-match condition is indicated when data bit C is LOW and data bit B is HIGH. However, if a logic HIGH state is stored at node N2 (i.e., data bit B is LOW), PMOS pass transistor 821 is turned off, and match line ML remains in a logic LOW state. Therefore, a match condition is indicated when data bits B and C are both LOW. Note that as a half-cell, CAM cell 800 only compares a logic LOW comparand with the stored data. A logic HIGH comparand on compare line KL would turn off PMOS pass transistor 822 regardless of the state of node N2. These operations of CAM cell 800 are summarized in Table 3.

TABLE 3

Match Function of CAM Cell 800

| Line KL | Node N2 | Match Circuit 820 | | Line ML | Status |
|---------|---------|-------------------|----------|---------|----------|
| [Bit C] | [Bit /B]| Trans. 821 | Trans. 822 | Line ML | Status |
| LOW | LOW | On | on | HIGH | No Match |
| LOW | HIGH | Off | on | LOW | Match |
| HIGH | LOW | On | off | LOW | n/a |
| HIGH | HIGH | Off | off | LOW | n/a |

Figure 9:
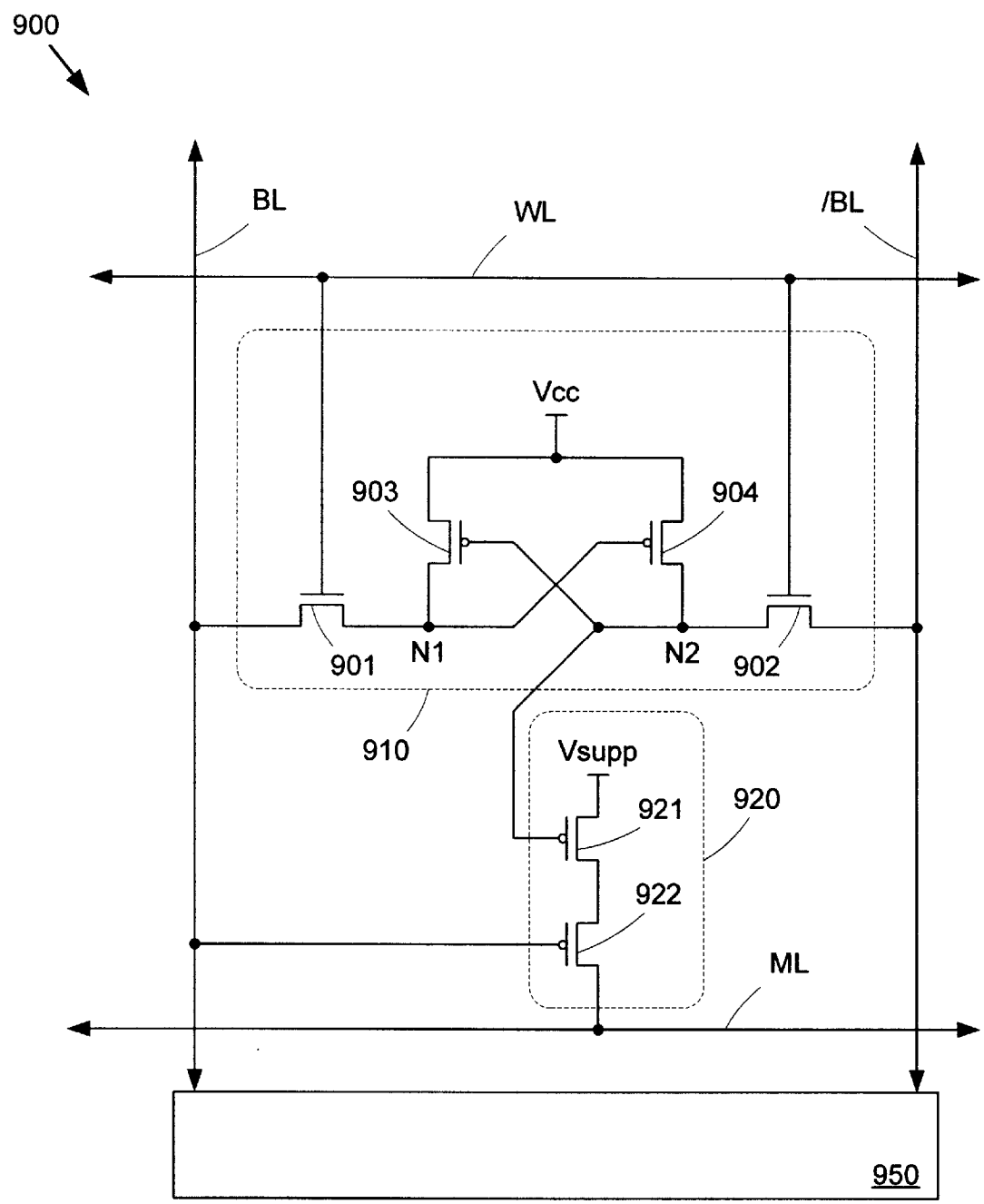
FIG. 9 is a CAM half-cell using a ratio-independent 4T SRAM cell and a shared bit line in accordance with an embodiment of the present invention.

FIG. 9 shows a CAM cell 900 in accordance with another embodiment of the present invention. CAM cell 900 comprises a 4T SRAM cell 910, a match circuit 920, a word line WL, a bit line BL, a complementary bit line /BL, and a match line ML. SRAM cell 910 comprises NMOS access transistors 901 and 902, and PMOS storage transistors 903 and 904, configured in substantially the same manner as 4T SRAM cell 700 shown in FIG. 7. PMOS transistors 903 and 904 are coupled between supply voltage Vcc and storage nodes N1 and N2, respectively. The gate terminals of PMOS transistor 903 and 904 are coupled to storage nodes N2 and N1, respectively. NMOS access transistor 901 is coupled between bit line BL and storage node N1, while NMOS access transistor 902 is coupled between complementary bit line /BL and storage node N2. The gates of both NMOS access transistors 901 and 902 are coupled to word line WL. Match circuit 920 comprises PMOS pass transistors 921 and 922, which are serially coupled between supply voltage Vcc and match line ML. The gate terminal of pass transistor 921 is coupled to storage node N2, while the gate terminal of pass transistor 922 is coupled to bit line BL.

According to an aspect of the present invention, PMOS driver transistors 903 and 904 can be located in an N-well coupled to receive a voltage greater than the Vcc supply voltage. This applied voltage advantageously provides a back-bias effect that raises the threshold voltage (VT) of PMOS driver transistors 903 and 904, thereby decreasing sub-threshold leakage and minimizing standby power consumption.

During a read or write operation, word line WL is raised HIGH, turning on access transistors 901 and 902. During a write operation data bit B is written from bit line BL into storage node N1, while a data bit /B, i.e., the complement of data bit B, is written from complementary bit line /BL into storage node N2. During a read operation, data bits B and /B are read from storage nodes N1 and N2, respectively, to bit lines BL and /BL, respectively. A differential regenerative sense amplifier (not shown) coupled to bit lines BL and /BL could read and regenerate the data stored in CAM cell 900.

When the data stored at nodes N1 and N2 are not being accessed, word line WL is held at a ground (i.e., logic LOW) voltage. At this time, bit lines BL and /BL are also held at ground potential. Under these conditions, the data storage node at a logic LOW voltage in 4T SRAM cell 910 is held at a voltage approximately equal to the ground voltage by the relatively large sub-threshold leakage current and junction leakage current through its associated NMOS access transistor. In this manner, the relatively leaky NMOS access transistors 901 and 902 contribute to the stability of CAM cell 900. The data storage node N1 or N2 at a logic LOW voltage causes its associated PMOS driver transistor 904 or 903, respectively to turn on, thereby keeping the potential at the logic HIGH node close to the Vcc supply voltage.

During a match operation, CAM cell 900 compares a comparand data bit C on bit line BL with stored data bit B. (Note that this comparison operation between bits B and C actually involves bit C and the complement of bit B, since match circuit 920 is coupled to node N2, where bit /B is stored.) If a match condition is detected between bits B and C, match circuit 920 remains turned off (i.e., PMOS pass transistor 921 is turned off, thereby disabling match circuit 920), thereby leaving the logic level of match line ML unchanged. However, if a no-match condition is detected between bits B and C, match circuit 920 turns on (i.e., PMOS pass transistors 921 and 922 are both turned on), thereby pulling match line ML to a prespecified logic level. In the embodiment shown in FIG. 9, match circuit 920 pulls match line ML to a logic HIGH voltage (i.e., supply voltage Vcc) when a no-match condition is detected. Alternatively, PMOS pass transistors 921 and 922 of match circuit 920 could be serially coupled between match line ML and ground supply voltage Vss, in which case match line ML would be pulled LOW (i.e., to voltage Vss) upon detection of a no-match condition.

To begin the process, word line WL is asserted to a logic LOW voltage to turn off NMOS access transistors 901 and 902, and match line ML is precharged to a logic LOW voltage. In accordance with another aspect of the present invention, if match circuit 920 was coupled between a ground supply voltage and match line ML, match line ML could be precharged to a logic HIGH voltage. Alternatively, match line ML could be set to float at the start of a match operation, thereby only asserting a definite voltage upon detection of a no-match condition by match circuit 920.

Once match line ML has been precharged to the specified voltage, a logic LOW comparand data bit C is then applied to bit line BL, turning on PMOS pass transistor 922. If a logic LOW is stored at node N2 (i.e., data bit B is HIGH), PMOS pass transistor 921 is also turned on, and match line ML is pulled to supply voltage Vcc. Therefore, a no-match condition is indicated when data bit C is LOW and data bit B is HIGH. However, if a logic HIGH state is stored at node N2 (i.e., data bit B is LOW), PMOS pass transistor 921 is turned off, and match line ML remains in a logic LOW state. Therefore, a match condition is indicated when data bits B and C are both LOW. Note that as a half-cell, CAM cell 900 only compares a logic LOW comparand with the stored data. A logic HIGH comparand on bit line BL would turn off PMOS pass transistor 922 regardless of the state of node N2. These operations of CAM cell 900 are summarized in Table 4.

TABLE 4

Match function of CAM Cell 900

| Line BL | Node N2 | Match Circuit 920 | | Line ML | Status |
|---------|---------|-------------------|---|---------|--------|
| [Bit C] | [Bit/B] | Trans. 921 | Trans. 922 | Line ML | Status |
| LOW | LOW | on | on | HIGH | No Match |
| LOW | HIGH | off | on | LOW | Match |
| HIGH | LOW | on | off | LOW | n/a |
| HIGH | HIGH | off | off | LOW | n/a |

Figure 10:
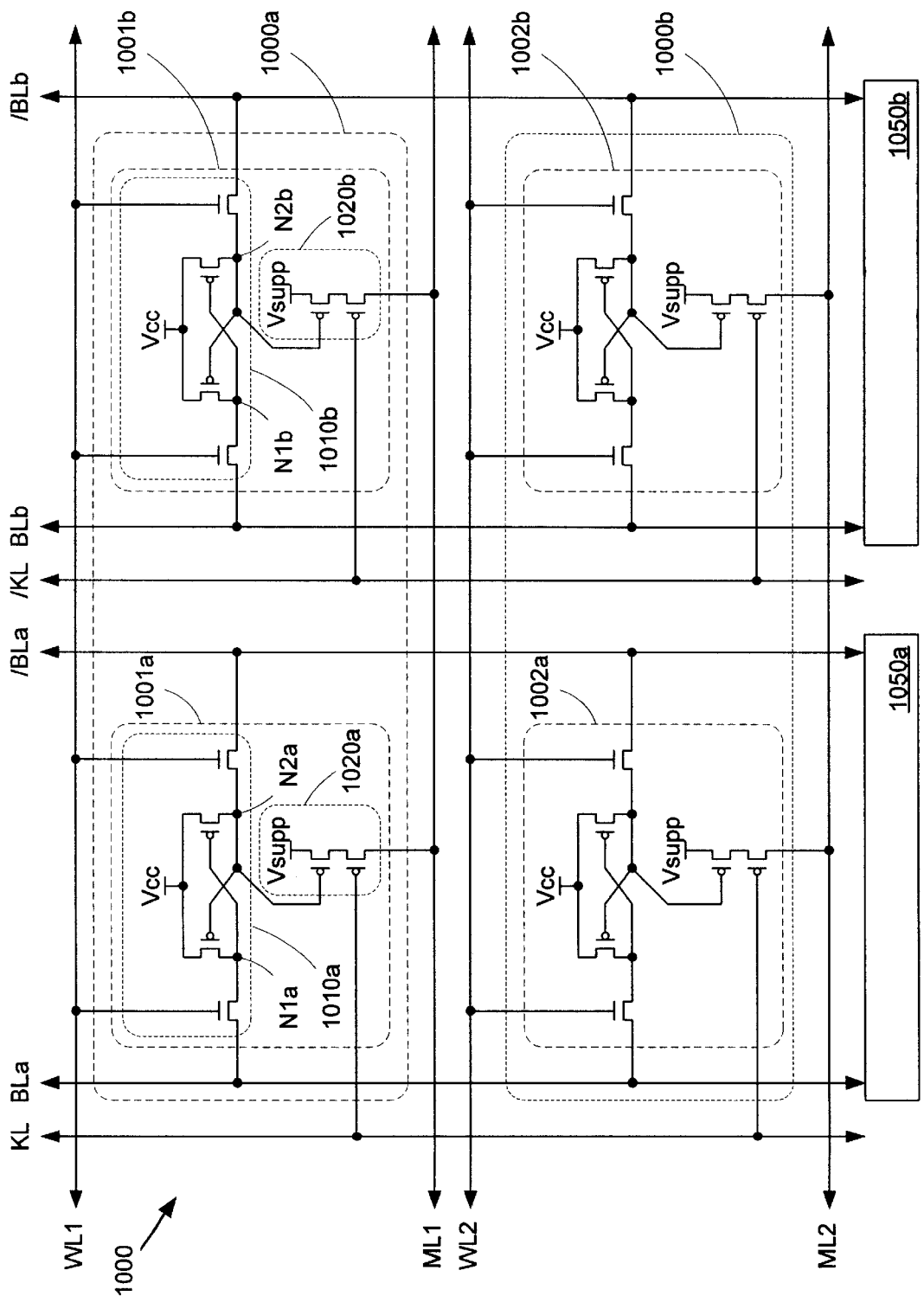
FIG. 10 is a ternary CAM array using dedicated compare lines in accordance with an embodiment of the present invention.

In accordance with an embodiment of the present invention, two half-cells can be combined to form a single ternary CAM cell. FIG. 10 shows a CAM array 1000 comprising ternary CAM cells 1000a and 1000b. CAM cell 1000a includes half-cells 1001a and 1001b, while CAM cell 1000b includes half-cells 1002a and 1002b. Half-cells 1001a, 1001b, 1002a, and 1002b are substantially similar to CAM cell 800 shown in FIG. 8. Half-cell 1001a comprises a 4T SRAM cell 1010a and a match circuit 1020a. Half-cell 1001b comprises a 4T SRAM cell 1010b and a match circuit 1020b. According to an aspect of the present invention, the PMOS driver transistors of 4T SRAM cells 1010a and 1010b can be located in an N-well coupled to receive a voltage greater than the Vcc supply voltage. This applied voltage advantageously provides a back-bias effect that raises the threshold voltage (VT) of those PMOS driver transistors, thereby decreasing sub-threshold leakage and minimizing standby power consumption.

CAM array 1000 further includes word lines WL1 and WL2, match lines ML1 and ML2, bit lines BLa and BLb, complementary bit lines /BLa and /BLb, a compare line KL, and a complementary compare line /KL. Half-cells 1001a and 1002a share bit lines BLa and /BLa and compare line KL. Half-cells 1001b and 1002b share bit lines BLb and /BLb and compare line /KL. Finally, half-cells 1001a and 1001b share word line WL1 and match line ML1, while half-cells 1002a and 1002b share word line WL2 and match line ML2.

The structure and operation of ternary CAM cells 1000a and 1000b are substantially the same. Therefore, while the following discussion specifically refers to only CAM cell 1000a, the same concepts apply to CAM cell 1000b.

The read and write operations of half-cells 1001a and 1001b in CAM cell 1000a are substantially similar to those described with respect to CAM cell 800 shown in FIG. 8.

During a write operation to CAM cell 1000a, a data bit Ba is stored in half-cell 1001a, and a data bit Bb is stored in half-cell 1001b. Word line WL1 is raised to a logic HIGH voltage to turn on the access transistors in half-cells 1001a and 1001b. Data bit Ba and its complementary data bit /Ba are then written into data storage nodes N1a and N2a, respectively, of half-cell 1001a from bit lines BLa and /BLa, respectively. Similarly, data bit Bb and its complementary data bit /Bb are written into data storage nodes N1b and N2b, respectively, of half-cell 1001b from bit lines BLb and /BLb, respectively. Typically, data bit Bb is the complement of data bit Ba, i.e., if bit Ba is HIGH, then Bb is LOW, and vice versa. However, both bits Ba and Bb can be set HIGH to store a "DON'T CARE" state in CAM cell 1000a. A DON'T CARE state causes CAM cell 1000a to return a match condition regardless of the state of comparand data bit C, thereby enabling the ternary function of the cell.

During a read operation, data bits Ba and /Ba are read from storage nodes N1a and N2a, respectively, to bit lines BLa and /BLa, respectively. Similarly, data bits Bb and /Bb are read from storage nodes N1b and N2b, respectively, to bit lines BLb and /BLb, respectively. Differential regenerative sense amplifiers (not shown) coupled to bit lines BLa, /BLa, BLb, and /BLb could read and regenerate the data stored in CAM cell 1000a.

According to an aspect of the present invention, when the data stored in 4T SRAM cells 1001a and 1001b are not being accessed, word line WL1 is held at a ground (i.e., logic LOW) voltage. At the same time, bit lines BLa, /BLa, BLb, and /BLb are also held at ground potential. Data stability is maintained in the manner described with respect to CAM cell 800.

During a match operation, CAM cell 1000a compares a comparand data bit C and a complementary comparand data bit /C with stored data bits Ba and Bb, respectively. First, word line WL1 is asserted to a logic LOW state to turn off the access transistors in half-cells 1001a and 1001b. In an embodiment of the present invention, match line ML1 is then precharged to a logic LOW state. Bit C is applied to compare line KL, and complementary bit /C is applied to complementary compare line /KL. If either match circuit 1020a or 1020b detects a no-match condition, match line ML1 is pulled to a logic HIGH voltage. Otherwise, ML is maintained at a logic LOW voltage, thereby indicating a match between bits C and B. In accordance with another embodiment of the present invention, match line ML1 is precharged to a logic HIGH voltage at the start of the match operation, and a no-match condition detected by either match circuit 1020a or 1020b pulls match line ML1 LOW. Alternatively, match line ML1 could be allowed to float at the start of the match operation, being pulled to a specific voltage only upon detection of a no-match condition.

Match circuits 1020a and 1020b of half-cells 1001a and 1001b, respectively, comprise serially coupled pass transistors controlled by a data storage node and a compare line. As described previously, match circuit 820 (FIG. 8) can only perform an match operation on a logic LOW comparand data bit; i.e., CAM cell 800 could detect a match/no-match condition for a logic LOW comparand, but could not make such a determination for a logic HIGH comparand.

In contrast, the combination of match circuits 1020a and 1020b allows CAM cell 1000a to perform a "complete" comparison operation. Because both bit C and its complementary bit /C are used as comparands (for half-cells 1001a and 1001b, respectively), at least one of the two will provide the desired logic LOW input to its associated match circuit. When stored data bits Ba and Bb are complements (i.e., whenever a DON'T CARE state is not stored in CAM cell 1000a), only one of half-cells 1001a and 1001b are required to make a match/no-match determination, i.e., a match or no-match condition in either of half-cells 1001a or 1001b is representative of the entire cell.

For example, assume comparand data bit C is at a logic HIGH state. Assume further that bit Ba stored in half-cell 1001a and bit Bb stored in half-cell 1001b are complements. Bit C on compare line KL would turn off match circuit 1020a in half-cell 1001a regardless of the state of stored bit Ba, precluding any match operation in half-cell 1001a. However, complementary comparand bit /C on line /KL would be LOW, enabling a match operation in half-cell 1001b. Therefore, a logic LOW bit Bb would cause match circuit 1020b to be fully turned on, raising match line ML1 to supply voltage Vcc to indicate a no-match condition. A logic HIGH bit Bb would cause match circuit 1020b to remain off, so that match line ML would remain LOW, thereby indicating a match condition.

However, if a DON'T CARE state had been written to CAM cell 1000a (i.e., bits Ba and Bb both logic HIGH), at least one transistor would always be off in match circuits 1020a and 1020b. Therefore, regardless of the state of comparand data bit C, match circuits 1020a and 1020b would always be off. Match line ML1 would consequently be maintained at a logic LOW voltage, and a match condition would be indicated regardless of the state of comparand bit C.

These operations of ternary CAM cell 1000a are summarized in Table 5.

PMOS driver transistors of 4T SRAM cells 1110a and 1110b can be located in an N-well coupled to receive a voltage greater than the Vcc supply voltage. This applied voltage advantageously provides a back-bias effect that raises the threshold voltage (VT) of those PMOS driver transistors, thereby decreasing sub-threshold leakage and minimizing standby power consumption.

CAM array 1100 further includes word lines WL1 and WL2, match lines ML1 and ML2, bit lines BLa and BLb, and complementary bit lines /BLa and /BLb. Half-cells 1101a and 1102a share bit lines BLa and /BLa. Half-cells 1101b and 1102b share bit lines BLb and /BLb. Finally, half-cells 1101a and 1101b share word line WL1 and match line ML1, while half-cells 1102a and 1102b share word line WL2 and match line ML2.

The structure and operation of ternary CAM cells 1100a and 1100b are substantially the same. Therefore, while the following discussion specifically refers to only CAM cell 1100a, the same concepts apply to CAM cell 1100b.

The read and write operations of half-cells 1101a and 1101b in CAM cell 1100a are substantially similar to those described with respect to CAM cell 900 shown in FIG. 9.

During a write operation to CAM cell 1100a, a data bit Ba is stored in half-cell 1101a, and a data bit Bb is stored in half-cell 1101b. Word line WL1 is raised to a logic HIGH voltage to turn on the access transistors in half-cells 1101a and 1101b. Data bit Ba and its complementary data bit /Ba are then written into data storage nodes N1a and N2a, respectively, of half-cell 1101a from bit lines BLa and /BLa, respectively. Similarly, data bit Bb and its complementary data bit /Bb are written into data storage nodes N1b and N2b, respectively, of half-cell 1101b from bit lines BLb and /BLb, respectively. Typically, data bit Bb is the complement of data bit Ba. However, both bits Ba and Bb can be set HIGH to store a "DON'T CARE" state in CAM cell 1100a. A DON'T CARE state causes CAM cell 1100a to return a match condition regardless of the state of comparand data bit C, thereby enabling the ternary function of the cell.

During a read operation, data bits Ba and /Ba are read from storage nodes N1a and N2a, respectively, to bit lines BLa and /BLa, respectively. Similarly, data bits Bb and /Bb

TABLE 5

Ternary Function of CAM Cell 1000a

| Line KL [Bit C] | Node N2a [Bit/Ba] | Match Cir. 1020a | Line/KL [Bit C] | Node N2b [Bit/Bb] | Match Cir. 1020b | Status |
| --- | --- | --- | --- | --- | --- | --- |
| LOW | LOW | on | HIGH | HIGH | off | No Match |
| LOW | HIGH | off | HIGH | LOW | off | Match |
| HIGH | LOW | off | LOW | HIGH | off | Match |
| HIGH | HIGH | off | LOW | LOW | on | No Match |
| HIGH | DONT CARE (HIGH) | off | LOW | DONT CARE (HIGH) | off | Match |
| HIGH | DONT CARE (HIGH) | off | LOW | DONT CARE (HIGH) | off | Match |

Figure 11:
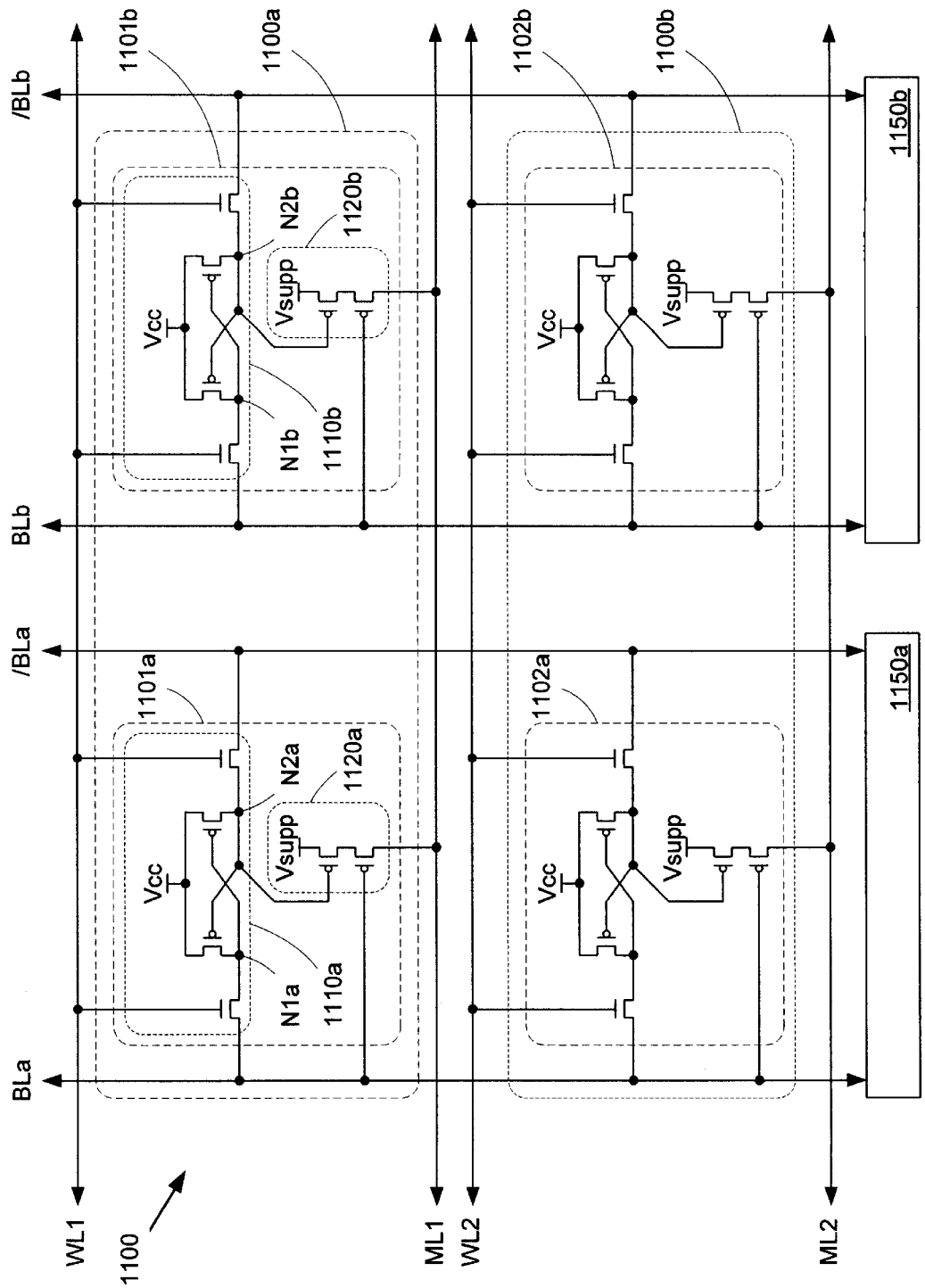
FIG. 11 is a ternary CAM array using shared bit lines in accordance with an embodiment of the present invention.
Figure 12:
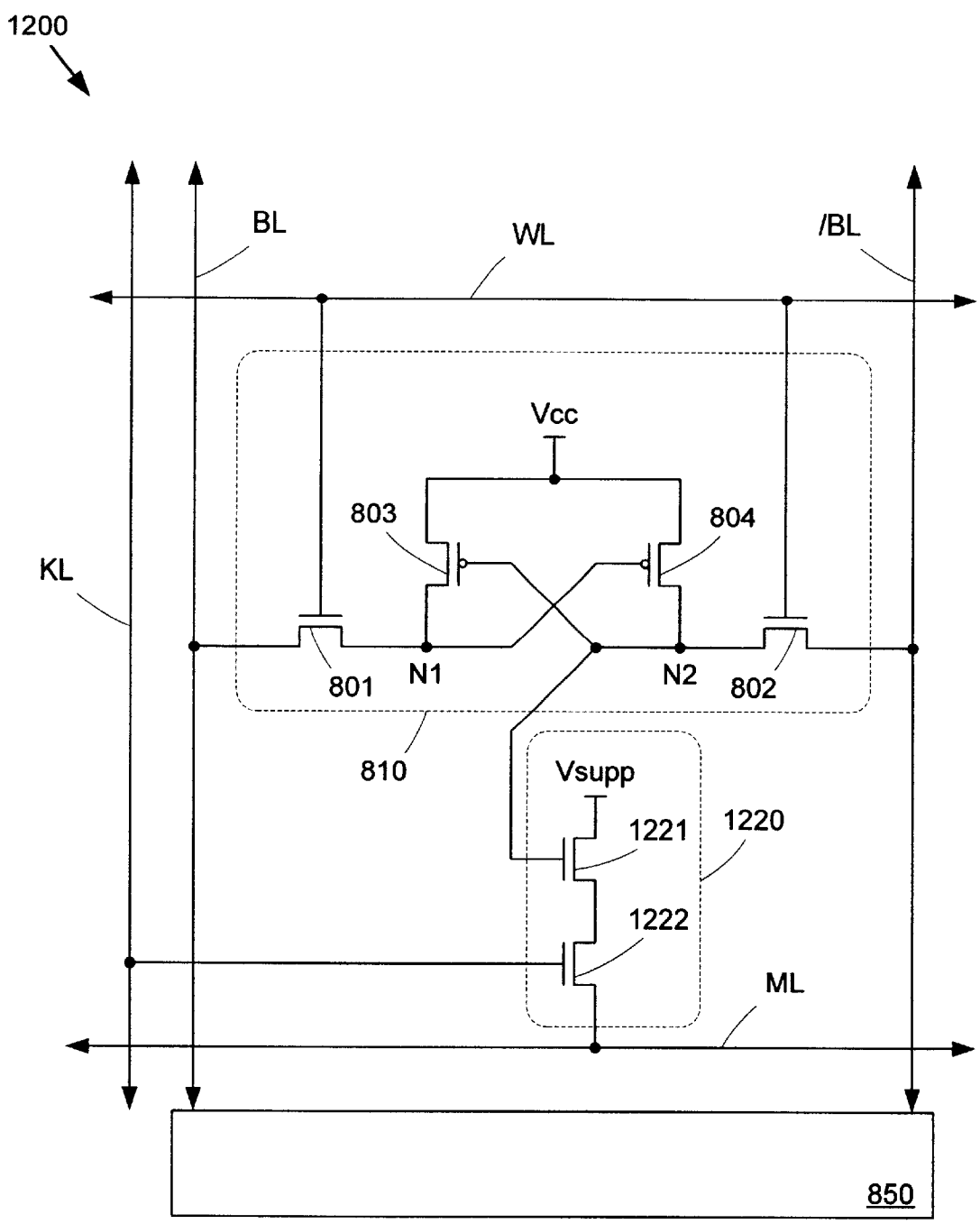
FIG. 12 is a CAM half-cell using a ratio-independent 4T SRAM cell, a dedicated compare line, and an NMOS match circuit in accordance with another embodiment of the present invention.
Figure 13:
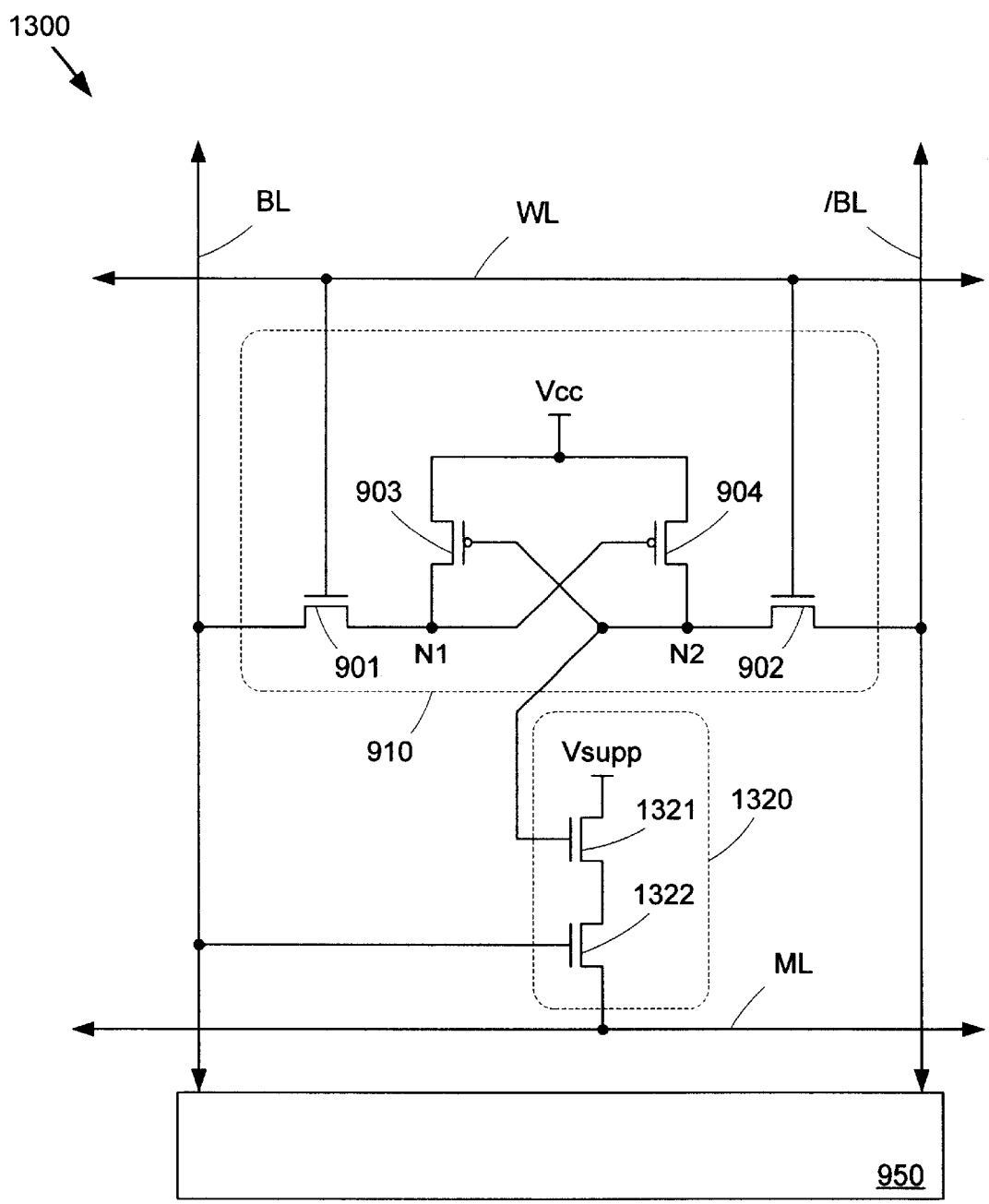
FIG. 13 is a CAM half-cell using a ratio-independent 4T SRAM cell, a shared bit line, and an NMOS match circuit in accordance with another embodiment of the present invention.
Figure 14:
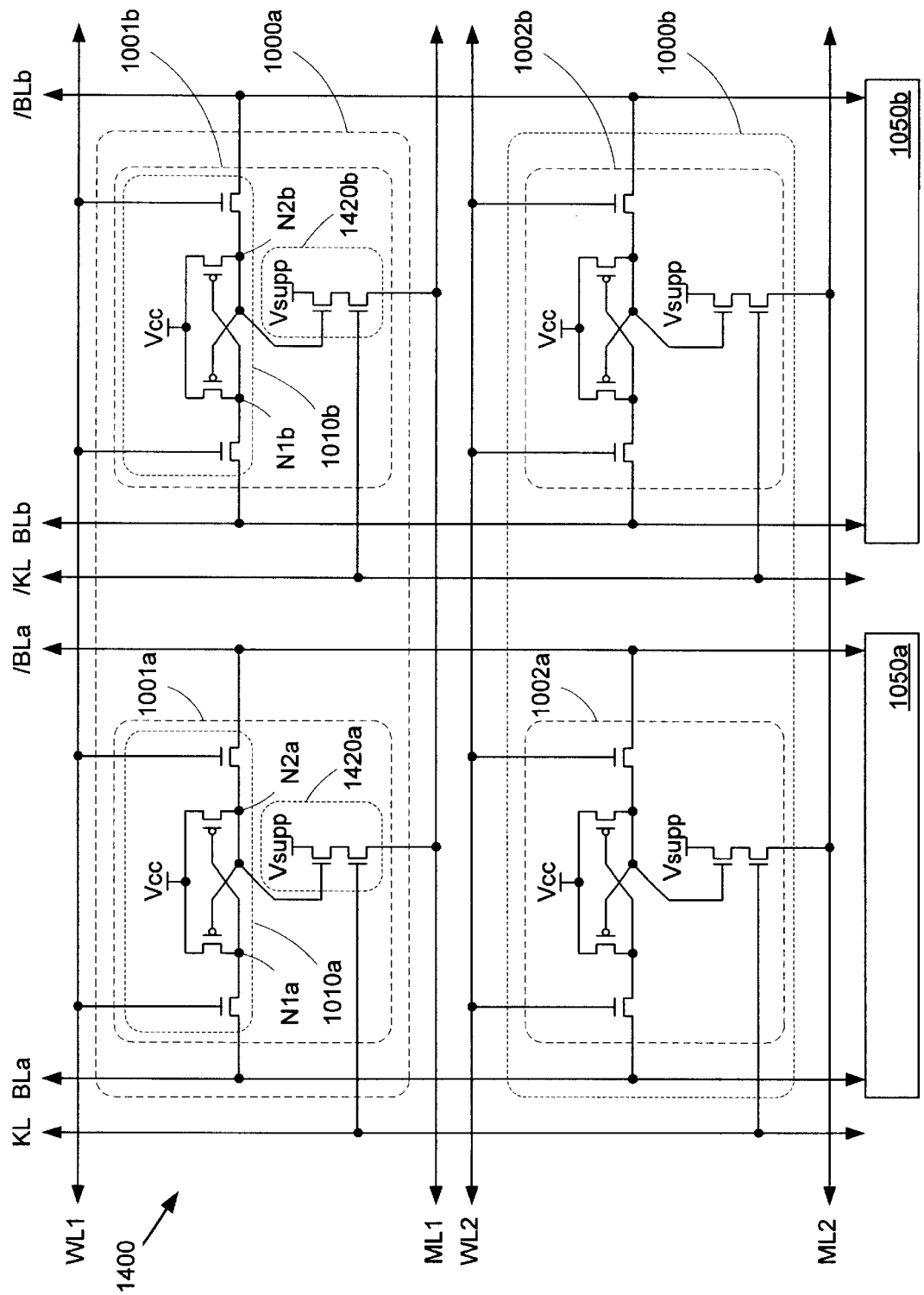
FIG. 14 is a ternary CAM array using dedicated compare lines and NMOS match circuits in accordance with another embodiment of the present invention.
Figure 15:
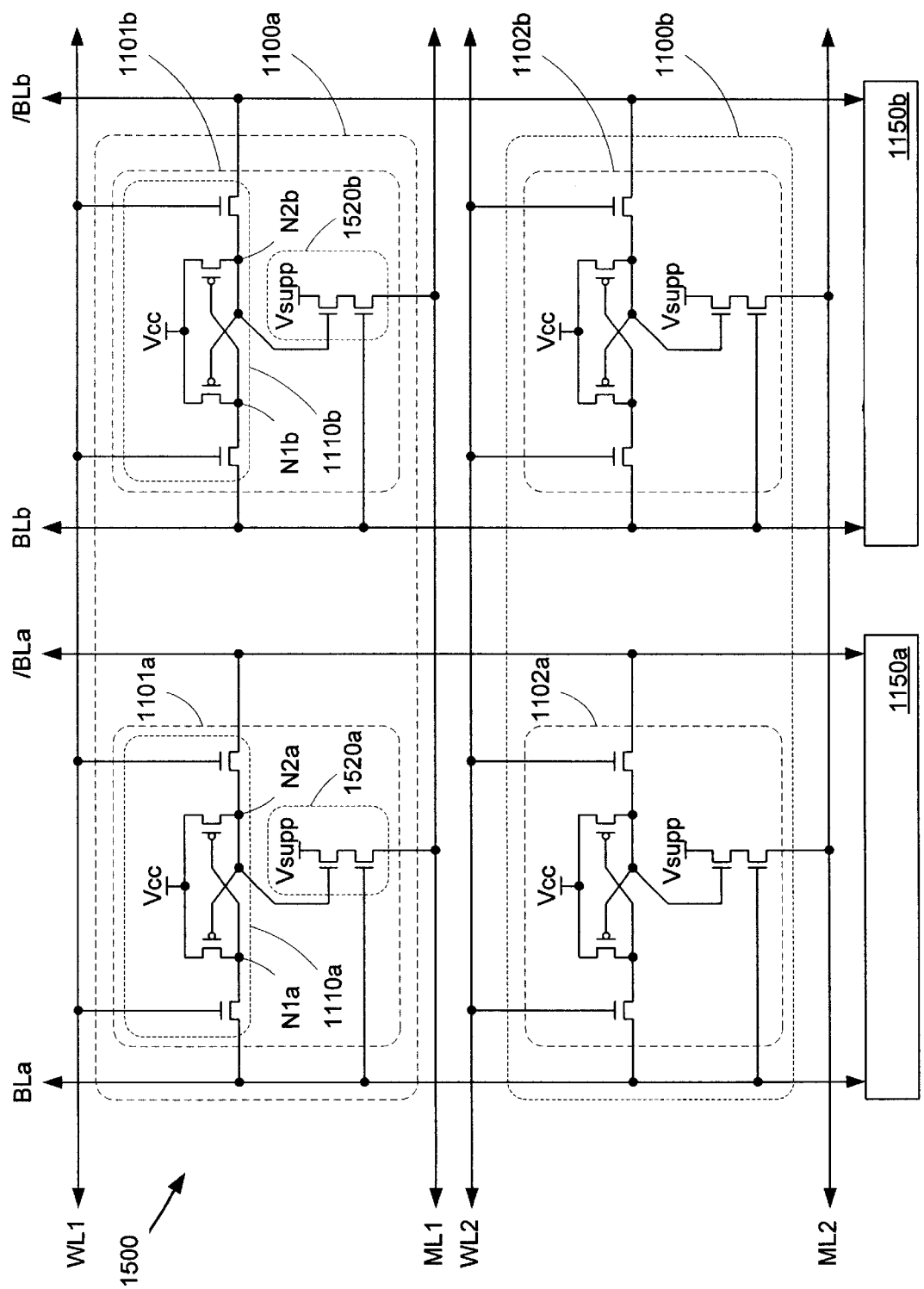
FIG. 15 is a ternary CAM array using shared bit lines and NMOS match circuits in accordance with another embodiment of the present invention.
Figure 16:
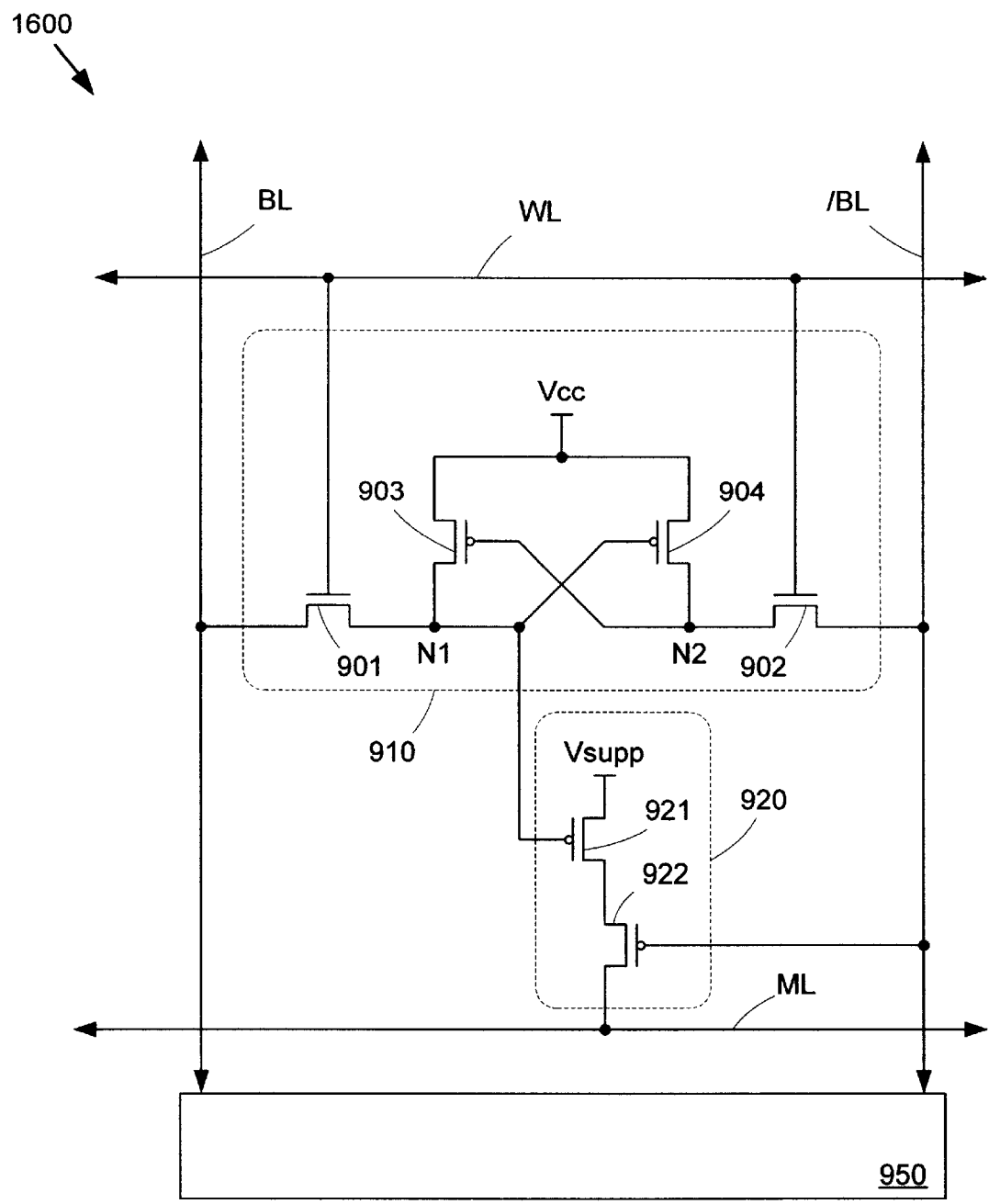
FIGS. 16 and 17 are CAM half-cells, each using a ratio-independent 4T SRAM cell and a shared bit line in accordance with other embodiments of the present invention.
Figure 17:
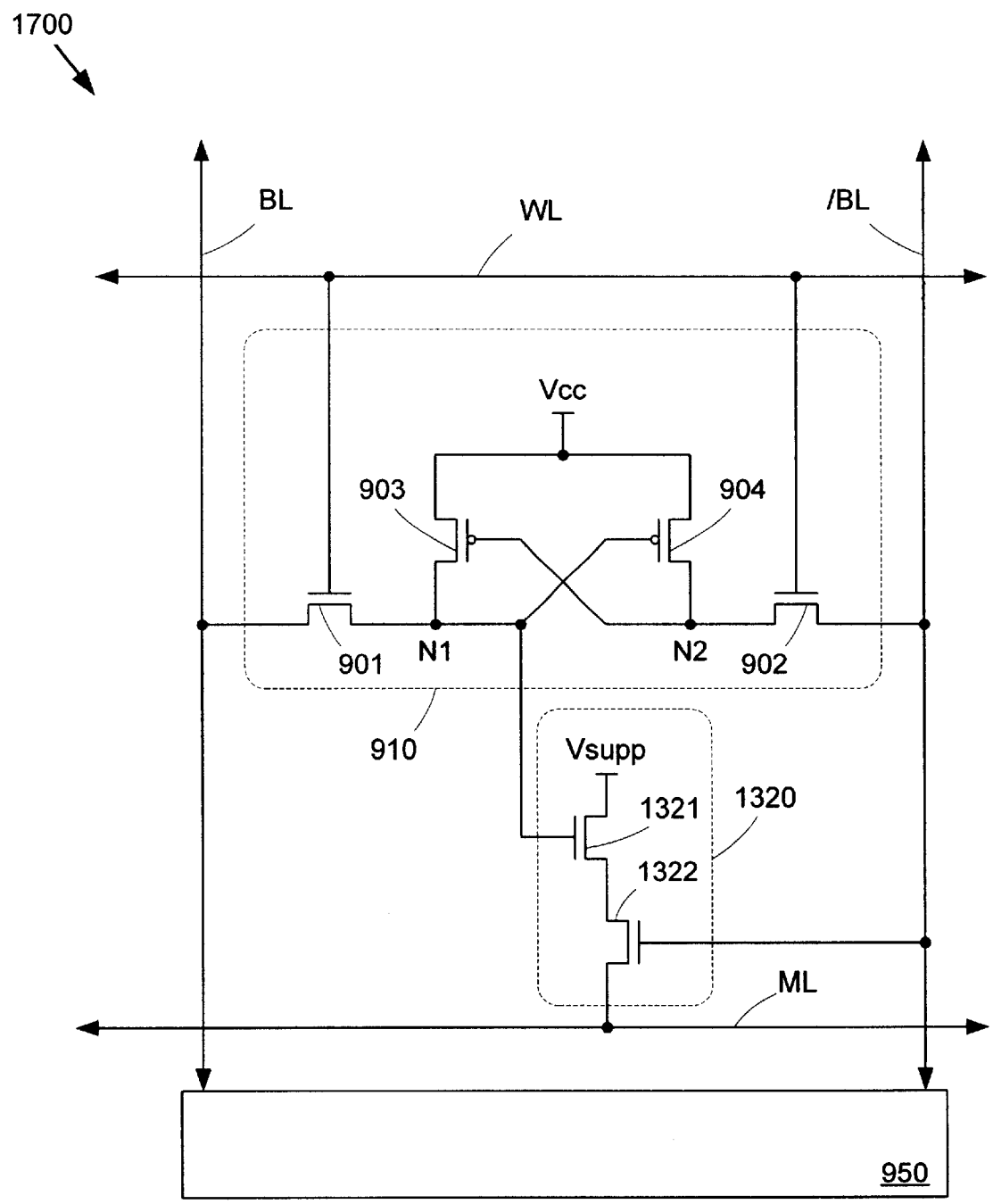

FIG. 11 shows a CAM array 1100 comprising ternary CAM cells 1100a and 1100b in accordance with another embodiment of the present invention. CAM cell 1100a includes half-cells 1101a and 1101b, while CAM cell 1100b includes half-cells 1102a and 1102b. Half-cells 1101a, 1101b, 1102a, and 1102b are substantially similar to CAM cell 900 shown in FIG. 9. Half-cell 1101a comprises a 4T SRAM cell 1110a and a match circuit 1120a. Half-cell 1101b comprises a 4T SRAM cell 1110b and a match circuit 1120b. According to an aspect of the present invention, the are read from storage nodes N1b and N2b, respectively, to bit lines BLb and /BLb, respectively. Differential regenerative sense amplifiers (not shown) coupled to bit lines BLa, /BLa, BLb, and /BLb could read and regenerate the data stored in CAM cell 1100a.

According to an aspect of the present invention, when the data stored in 4T SRAM cells 1101a and 1101b are not being accessed, word line WL1 is held at a ground (i.e., logic LOW) voltage. At the same time, bit lines BLa, /BLa, BLb, and /BLb are also held at ground potential. Data stability is maintained in the manner described with respect to CAM cell 900.

During a match operation, CAM cell 1100a compares a comparand data bit C and a complementary comparand data bit /C with stored data bits Ba and Bb, respectively. First, word line WL1 is asserted to a logic LOW state to turn off the access transistors in half-cells 1101a and 1101b. In an embodiment of the present invention, match line ML1 is then precharged to a logic LOW state. Bit C is applied to bit line BLa, and complementary bit /C is applied to bit line BLb. CAM cell 1100a advantageously eliminates the dedicated compare lines shown in FIG. 10 by using bit lines BLa and BLb for both write and compare operations. If either match circuit 1120a or 1120b detects a no-match condition, then match line ML1 is pulled to a logic HIGH voltage. Otherwise, ML is maintained at a logic LOW voltage, indicating a match between bits C and B. In accordance with another embodiment of the present invention, match line ML1 is precharged to a logic HIGH voltage at the start of the match operation, and a no-match condition detected by either match circuit 1120a or 1120b pulls match line ML1 LOW. Alternatively, match line ML1 could be allowed to float at the start of the match operation, being pulled to a specific voltage only upon detection of a no-match condition.

Match circuits 1120a and 1120b of half-cells 1101a and 1101b, respectively, comprise serially coupled pass transistors controlled by a data storage node and a compare line. As described previously, match circuit 920 (FIG. 9) can only perform an match operation on a logic LOW comparand data bit; i.e., CAM cell 900 could detect a match/no-match condition for a logic LOW comparand, but could not make such a determination for a logic HIGH comparand.

In contrast, the combination of match circuits 1120a and 1120b allows CAM cell 1100a to perform a "complete" comparison operation. Because both bit C and its complementary bit /C are used as comparands (for half-cells 1101a and 1101b, respectively), at least one of the two will provide the desired logic LOW input to its associated match circuit. When stored data bits Ba and Bb are complements (i.e., whenever a DON'T CARE state is not stored in CAM cell 1100a), only one of half-cells 1101a and 1101b are required to make a match/no-match determination, i.e., a match or no-match condition in either of half-cells 1101a or 1101b is representative of the entire cell.

For example, assume comparand data bit C is at a logic HIGH state. Assume further that bit Ba stored in half-cell 1101a and bit Bb stored in half-cell 1101b are complements. Bit C on bit line BLa would turn off match circuit 1120a in half-cell 1101a regardless of the state of stored bit Ba, precluding any match operation in half-cell 1101a. However, complementary comparand bit /C on bit line BLb would be LOW, enabling a match operation in half-cell 1101b. Therefore, a logic LOW bit Bb would cause match circuit 1120b to be fully turned on, thereby raising match line ML1 to supply voltage Vcc to indicate a no-match condition. A logic HIGH bit Bb would cause match circuit 1120b to remain off, so that match line ML would remain LOW, indicating a match condition.

However, if a DON'T CARE state had been written to CAM cell 1100a (i.e., bits Ba and Bb both logic HIGH), at least one transistor would always be off in match circuits 1120a and 1120b. Therefore, regardless of the state of comparand data bit C, match circuits 1120a and 1120b would always be off. Match line ML1 would consequently be maintained at a logic LOW voltage, and a match condition would be indicated regardless of the state of comparand bit C.

These operations of ternary CAM cell 1100a are summarized in Table 6.

TABLE 6

| | | Ternary Function of CAM Cell 1100a | | | | |
|---|---|---|---|---|---|---|
| Line BLa [Bit C] | Node N2a [Bit/Ba] | Match Cir. 1120a | Line BLb [Bit/C] | Node N2b [Bit/Bb] | Match Cir. 1120b | Status |
| LOW | LOW | on | HIGH | HIGH | off | No Match |
| LOW | HIGH | off | HIGH | LOW | off | Match |
| HIGH | LOW | off | LOW | HIGH | off | Match |
| HIGH | HIGH | off | LOW | LOW | on | No Match |
| HIGH | DONT CARE (HIGH) | off | LOW | DONT CARE (HIGH) | off | Match |
| HIGH | DONT CARE (HIGH) | off | LOW | DONT CARE (HIGH) | off | Match |

Although the invention has been described in connection with several embodiments, it is understood that this invention is not limited to the embodiments disclosed. For example, the PMOS pass transistors used in the match circuits of FIGS. 8, 9, 10, and 11 could be replaced with NMOS pass transistors, in which case match operations would only be performed on logic HIGH comparand data bits. Also, the match circuits could be coupled to the opposite data storage node (i.e., the non-complementary node) and the complementary bit line. Various modifications of this sort will be readily apparent to one of ordinary skill in the art. Therefore, the invention is limited only by the following claims.

We claim:

1. A content addressable memory (CAM) cell comprising:
   a word line;
   a first bit line;
   a second bit line; and
   a match line;
   a first match circuit coupled to the match line; and
   a first four-transistor (4T) static random access memory (SRAM) cell coupled to the first match circuit, the first 4T SRAM cell comprising:
   a first PMOS driver transistor;
   a second PMOS driver transistor, the first PMOS driver transistor and the second PMOS driver transistor being cross-coupled to store a first data value;
   a first NMOS access transistor coupled between the first bit line and the gate of the second PMOS driver transistor, the gate of the first NMOS access transistor being coupled to the word line; and a second NMOS access transistor, coupled between the second bit line and the gate of the first PMOS driver transistor, the gate of the second NMOS access transistor being coupled to the word line, wherein the first PMOS driver transistor and the second PMOS driver transistor have a first strength and the first NMOS access transistor and the second NMOS access transistor have a second strength, wherein the first strength is less than three times the second strength.

2. The CAM cell of claim 1, wherein the first PMOS driver transistor and the second PMOS driver transistor are located in an N-well which is coupled to receive a voltage greater than a Vcc supply voltage.

3. The CAM cell of claim 1, wherein the first PMOS driver transistor, the second PMOS driver transistor, the first NMOS access transistor, and the second NMOS access transistor are approximately the same size.

4. The CAM cell of claim 1, wherein the first PMOS driver transistor, the second PMOS driver transistor, the first NMOS access transistor, and the second NMOS access transistor have channel widths that correspond with a minimum channel width of a process used to fabricate the CAM cell.

5. The CAM cell of claim 1, wherein:

the first PMOS driver transistor is coupled between a positive voltage supply terminal and a first storage node, the gate of the first PMOS driver transistor being coupled to a second storage node; and the second PMOS driver transistor is coupled between the positive supply voltage terminal and the second storage node, the gate of the second PMOS driver transistor being coupled to the first storage node.

6. The CAM cell of claim 5, further comprising a regenerative sense amplifier coupled to the first bit line and the second bit line.

7. The CAM cell of claim 5, wherein the first match circuit comprises:

a first pass transistor; and a second pass transistor, the first pass transistor and the second pass transistor being serially coupled between a supply voltage terminal and the match line.

8. The CAM cell of claim 7, wherein the supply voltage terminal is the positive supply voltage terminal.

9. The CAM cell of claim 7, wherein the supply voltage terminal is a ground supply voltage terminal.

10. The CAM cell of claim 7, wherein the first pass transistor and the second pass transistor are both PMOS transistors.

11. The CAM cell of claim 7, wherein the first pass transistor and the second pass transistor are both NMOS transistors.

12. The CAM cell of claim 7, further comprising a compare line, wherein:

the gate of the first pass transistor is coupled to the second storage node; and the gate of the second pass transistor is coupled to the compare line.

13. The CAM cell of claim 7, wherein:

the gate of the first pass transistor is coupled to the second storage node; and the gate of the second pass transistor is coupled to the first bit line.

14. The CAM cell of claim 7, wherein:

the gate of the first pass transistor is coupled to the first storage node; and the gate of the second pass transistor is coupled to the second bit line.

15. The CAM cell of claim 1, further comprising:

a third bit line;

a fourth bit line;

a second match circuit coupled to the match line; and a second 4T SRAM cell coupled to the second match circuit, the second 4T SRAM cell comprising:

a third PMOS driver transistor;

a fourth PMOS driver transistor, the third PMOS driver transistor and the fourth PMOS driver transistor being cross-coupled to store a second data value;

a third NMOS access transistor coupled between the third bit line and the gate of the fourth PMOS driver transistor, the gate of the third NMOS access transistor being coupled to the word line; and a fourth NMOS access transistor coupled between the fourth bit line and the gate of the third PMOS driver transistor, the gate of the fourth NMOS access transistor being coupled to the word line, wherein the third PMOS driver transistor and the fourth PMOS driver transistor have the first strength and the third NMOS access transistor and the fourth NMOS access transistor have the second strength.

16. The CAM cell of claim 15, wherein the first PMOS driver transistor, the second PMOS driver transistor, the third PMOS driver transistor, and the fourth PMOS driver transistor are located in an N-well which is coupled to receive a voltage greater than a Vcc supply voltage.

17. The CAM cell of claim 15, wherein the first PMOS driver transistor, the second PMOS driver transistor, the third PMOS driver transistor, the fourth PMOS driver transistor, the first NMOS access transistor, the second NMOS access transistor, the third NMOS access transistor, and the fourth NMOS access transistor are approximately the same size.

18. The CAM cell of claim 15, wherein the first PMOS driver transistor, the second PMOS driver transistor, the third PMOS driver transistor, the fourth PMOS driver transistor, the first NMOS access transistor, the second NMOS access transistor, the third NMOS access transistor, and the fourth NMOS access transistor have channel widths that correspond with a minimum channel width of a process used to fabricate the CAM cell.

19. The CAM cell of claim 15, wherein:

the first PMOS driver transistor is coupled between a positive voltage supply terminal and a first storage node, the gate of the first PMOS driver transistor being coupled to a second storage node;

the second PMOS driver transistor is coupled between the positive supply voltage terminal and the second storage node, the gate of the second PMOS driver transistor being coupled to the first storage node;

the third PMOS driver transistor is coupled between the positive voltage supply terminal and a third storage node, the gate of the third PMOS driver transistor being coupled to a fourth storage node; and the fourth PMOS driver transistor is coupled between the positive supply voltage terminal and the fourth storage node, the gate of the fourth PMOS driver transistor being coupled to the third storage node.

20. The CAM cell of claim 19, further comprising:
a first regenerative sense amplifer coupled to the first bit line and the second bit line; and
a second regenerative sense amplifer coupled to the third bit line and the fourth bit line.

21. The CAM cell of claim 15, wherein:
the first match circuit is coupled to the first bit line; and
the second match circuit is coupled to the third bit line.

22. The CAM cell of claim 15, further comprising:
a first compare line; and
a second compare line, the first match circuit being coupled to the first compare line, and the second match circuit being coupled to the second compare line.

23. A method of operating a content addressable memory (CAM) cell comprising a first four-transistor (4T) static random access memory (SRAM) cell, the first 4T SRAM cell comprising a first pair of cross-coupled driver transistors and a first pair of access transistors, wherein the first pair of driver transistors have a first strength and the first pair of access transistors have a second strength, wherein the first strength is less than three times the second strength, the method comprising the steps of:
storing a first data value in the first SRAM cell; and
equalizing a voltage on a first pair of bit lines coupled to the first pair of access transistors to a specified voltage potential when the first 4T SRAM cell is not being accessed.

24. The method of claim 23, wherein the specified voltage potential is a positive supply voltage.

25. The method of claim 23, wherein the specified voltage potential is a ground supply voltage.

26. The method of claim 23, further comprising the step of applying a voltage greater than a positive supply voltage to the body terminals of the first pair of driver transistors.

27. The method of claim 23, further comprising the step of maintaining a first storage node of the first 4T SRAM cell at approximately ground potential by sub-threshold leakage current flowing through one of the first pair of access transistors.

28. The method of claim 23, wherein the first strength is not greater than the second strength.

29. The method of claim 23, further comprising the step of performing a match operation on a comparand data value, the step of performing the match operation comprising the steps of:
precharging a match line to a first voltage;
comparing the comparand data value with the first data value;
pulling the match line to a second voltage when detecting a no-match condition between the first data value and the comparand data value.

30. The method of claim 29, wherein the first voltage is a ground supply voltage and the second voltage is a positive supply voltage.

31. The method of claim 29, wherein the first voltage is a positive supply voltage and the second voltage is a ground supply voltage.

32. The method of claim 29, wherein the first voltage is a floating voltage state.

33. The method of claim 23, the CAM cell further comprising a second 4T SRAM cell, the second 4T SRAM cell comprising a second pair of cross-coupled driver transistors and a second pair of access transistors, wherein the second pair of driver transistors have the first strength and the second pair of access transistors have the second strength, the method further comprising the steps of:
storing a second data value in the second 4T SRAM cell; and
equalizing a voltage on a second pair of bit lines coupled to the second pair of access transistors to the specified voltage potential when the second 4T SRAM cell is not being accessed.

34. The method of claim 33, further comprising the step of applying a voltage greater than a positive supply voltage to the body terminals of the first pair of driver transistors and the second pair of driver transistors.

35. The method of claim 33, further comprising the steps of:
maintaining a first storage node of the first 4T SRAM cell at approximately ground potential by sub-threshold leakage current flowing through one of the first pair of access transistors; and
maintaining a second storage node of the second 4T SRAM cell at approximately ground potential by sub-threshold leakage current flowing through one of the second pair of access transistors.

36. The method of claim 33, wherein the first strength is not greater than the second strength.

37. The method of claim 33, further comprising the step of performing a match operation on a comparand data value, the step of performing the match operation comprising the steps of:
precharging a match line to a first voltage;
comparing the comparand data value with the first data value;
comparing a complement of the comparand data value with the second data value;
pulling the match line to a second voltage when a no-match condition is detected between the first data value and the comparand data value or the second data value and a complement of the comparand data value.

38. The method of claim 37, wherein:
the step of pulling the match line to the second voltage is performed by a first match circuit when a no-match condition is detected between the first data value and the comparand data value, and by a second match circuit when a no-match condition is detected between the second data value and the complement of the comparand data value, and
the first data value and the second data value are both equal to a third voltage, the third voltage being selected to turn off the first match circuit and the second match circuit.

* * * * *